United States Patent [19]
Nishiyama et al.

[11] Patent Number: 5,641,581
[45] Date of Patent: Jun. 24, 1997

[54] SEMICONDUCTOR DEVICE

[75] Inventors: Yukio Nishiyama, Yokohama; Rempei Nakata, Kawasaki; Nobuo Hayasaka, Yokosuka; Haruo Okano; Riichirou Aoki, both of Tokyo; Takahito Nagamatsu, Kawasaki; Akemi Satoh, Sagamihara; Masao Toyosaki, Kawasaki; Hitoshi Ito, Yokohama, all of Japan

[73] Assignee: Kabushiki Kaisha Toshiba, Kawasaki, Japan

[21] Appl. No.: 411,994

[22] Filed: Mar. 28, 1995

Related U.S. Application Data

[62] Division of Ser. No. 94,423, Jul. 16, 1993, Pat. No. 5,429,995.

[30] Foreign Application Priority Data

Jul. 17, 1992 [JP] Japan ................. 4-191067
Apr. 27, 1993 [JP] Japan ................. 5-099971
Jul. 2, 1993 [JP] Japan ................. 5-164831

[51] Int. Cl.$^6$ ................................. B32B 9/00
[52] U.S. Cl. ........................ 428/688; 428/689
[58] Field of Search ................ 428/688, 689, 428/701, 702; 437/132; 257/53, 57, 458

[56] References Cited

U.S. PATENT DOCUMENTS

| | | | |
|---|---|---|---|
| 4,476,346 | 10/1984 | Tawada | 257/53 |
| 5,141,894 | 8/1992 | Bisaro | 437/132 |
| 5,213,628 | 5/1993 | Noguchi | 257/458 |
| 5,313,075 | 5/1994 | Zhang | 257/57 |

*Primary Examiner*—Patrick Ryan
*Assistant Examiner*—Patrick Jewik
*Attorney, Agent, or Firm*—Oblon, Spivak, McClelland, Maier & Neustadt, P.C.

[57] ABSTRACT

Disclosed is a method of manufacturing a semiconductor device, in which a silicon oxide film containing fluorine, said film exhibiting a low dielectric constant and a low hygroscopicity and acting as an insulating film for electrically isolating wirings included in a semiconductor device, is formed by a plasma CVD method using a source gas containing at least silicon, oxygen and fluorine, under the conditions that the relationship between the gas pressure P (Torr) and the ion energy E (eV) satisfies formula A given below:

$$P \geq 5 \times 10^{-4}, \quad P \leq 10^{-1 \times 10^{-E/45}} \quad (A)$$

and the relationship between the ion energy E (eV) and the plasma density D ($/cm^3$) satisfies the formula B given below:

$$D \geq 2 \times 10^{11 \times 10^{-E/45}}, \quad 10 \leq E \quad (B)$$

4 Claims, 18 Drawing Sheets

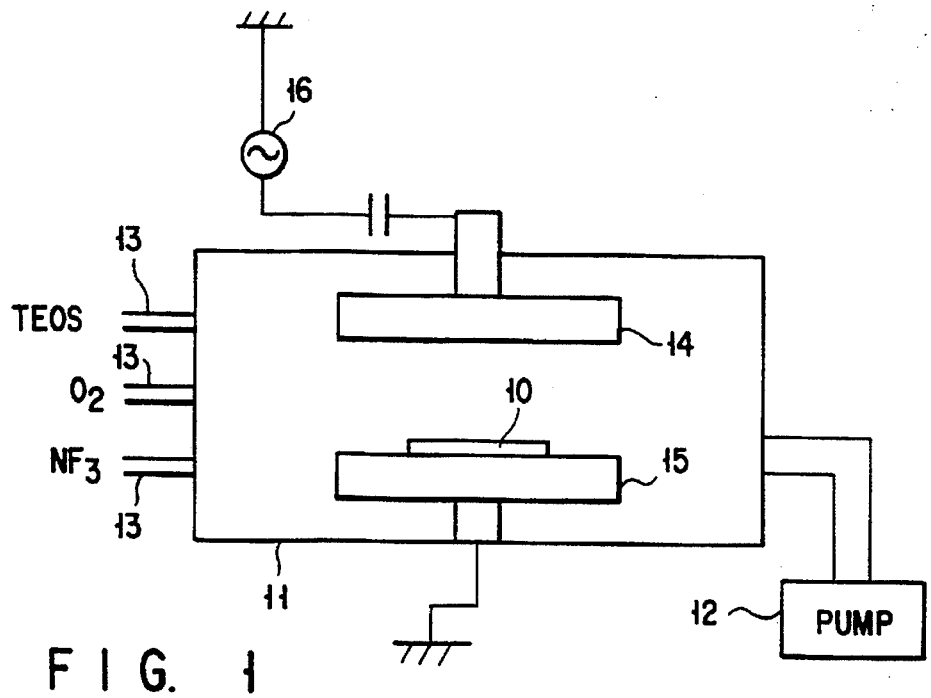
F I G. 1
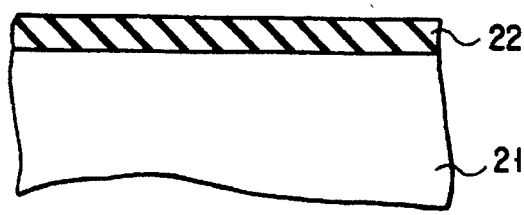
F I G. 2A
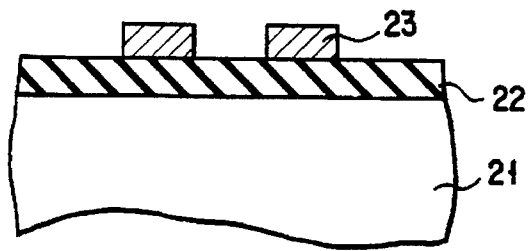
F I G. 2B
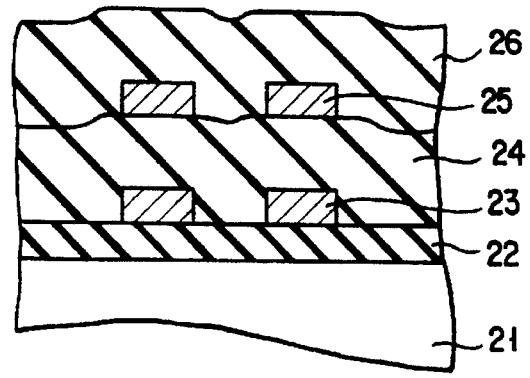
F I G. 2C

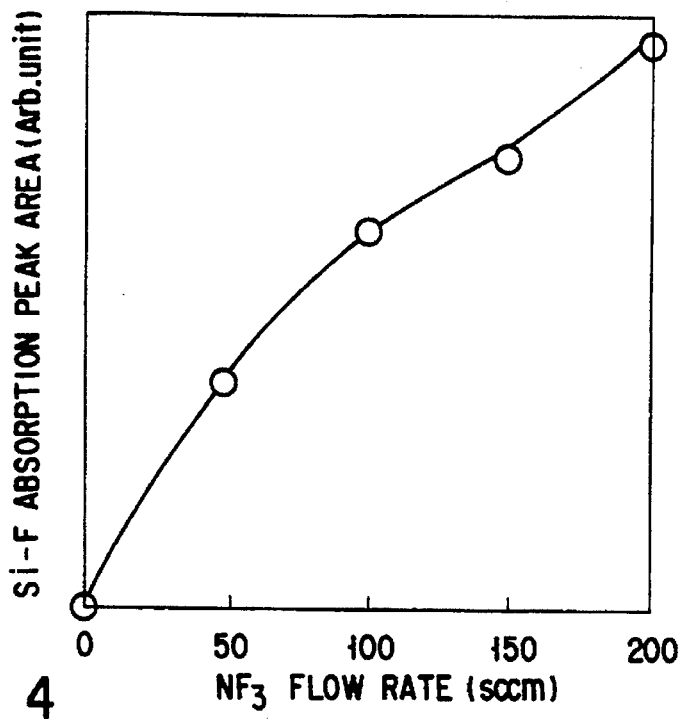
F I G. 4
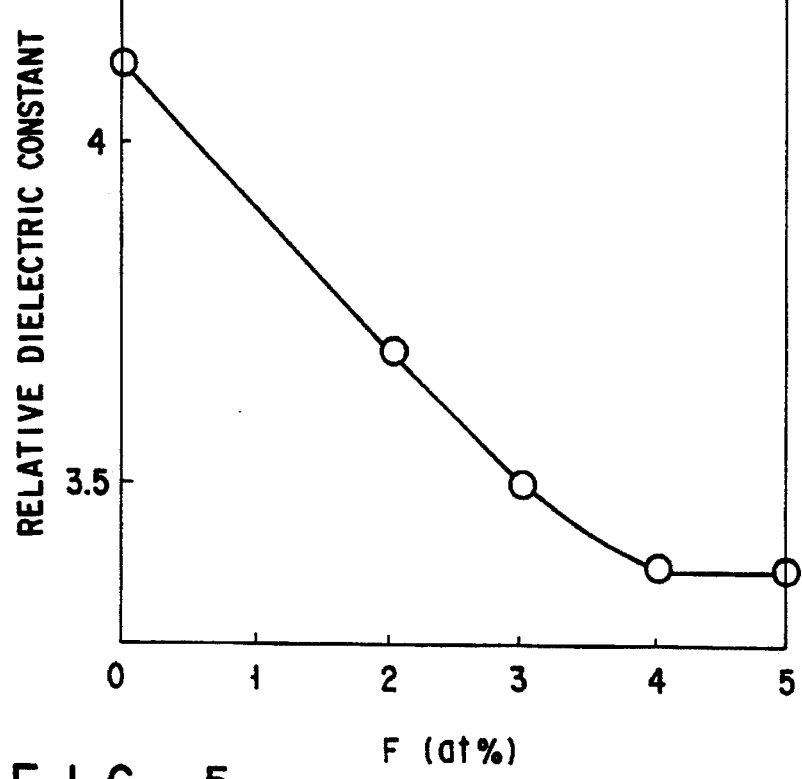
F I G. 5

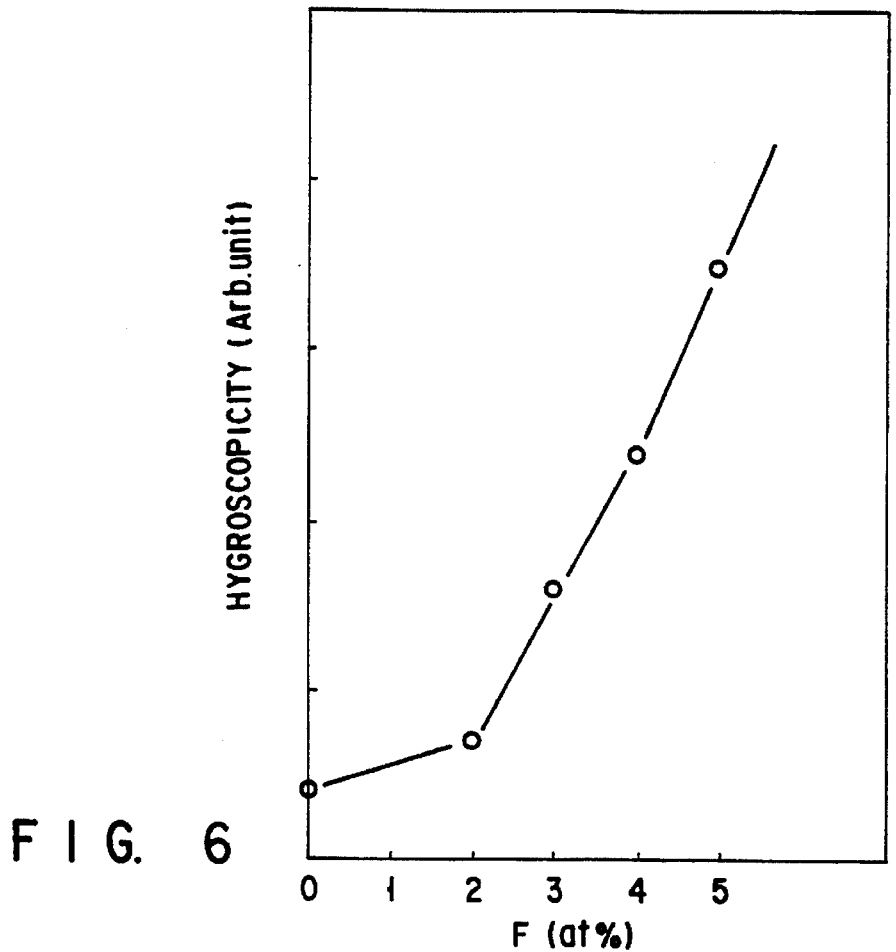
F I G. 6
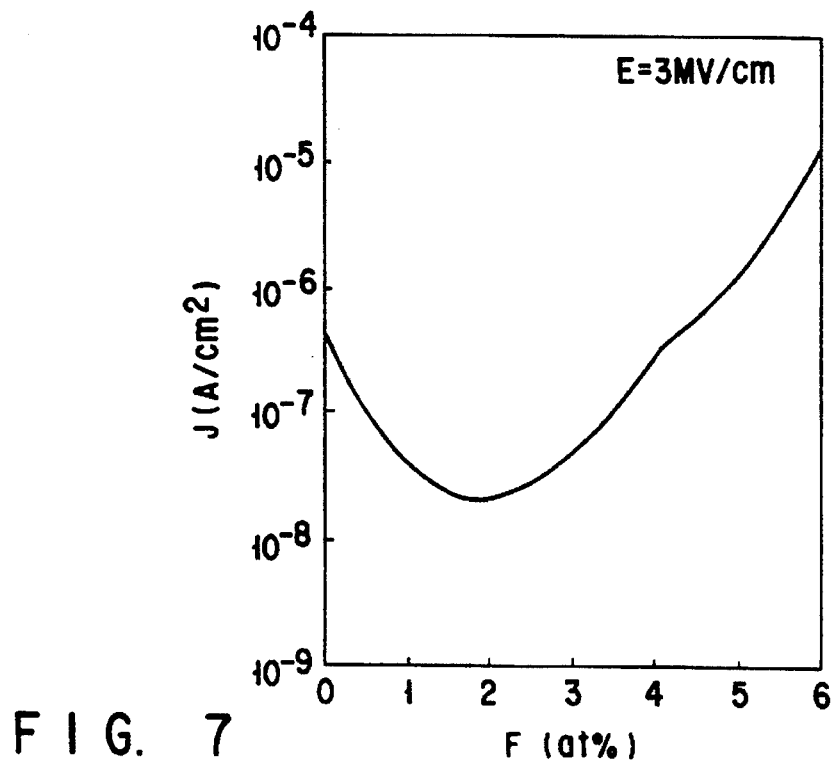
F I G. 7

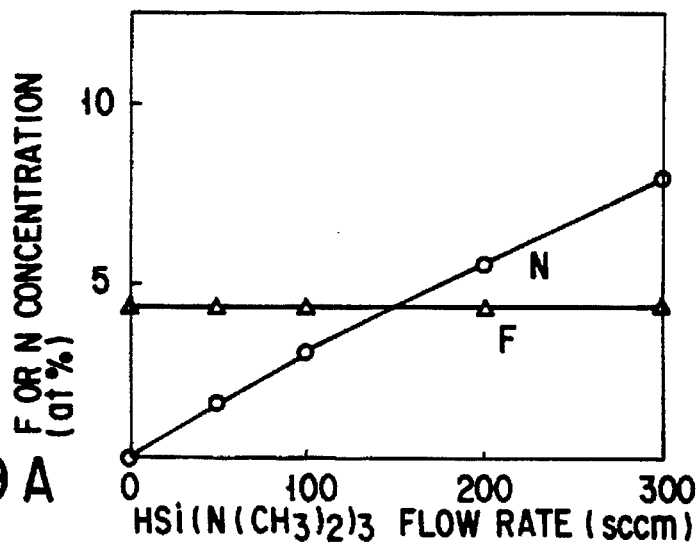
F I G. 9A
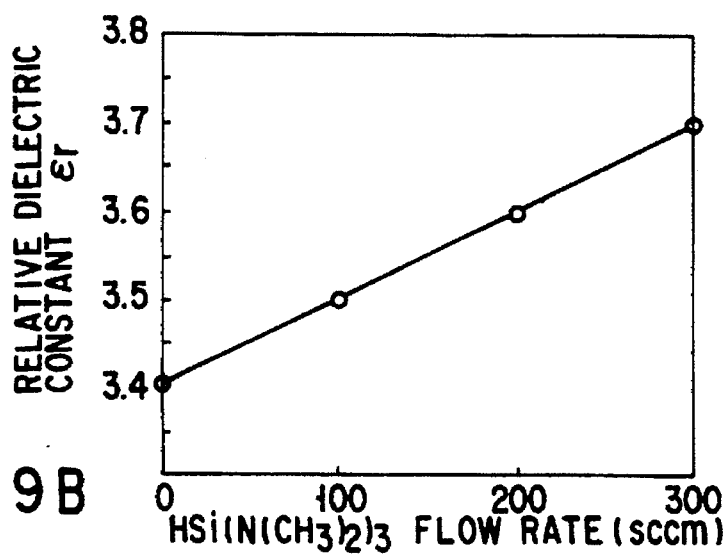
F I G. 9B
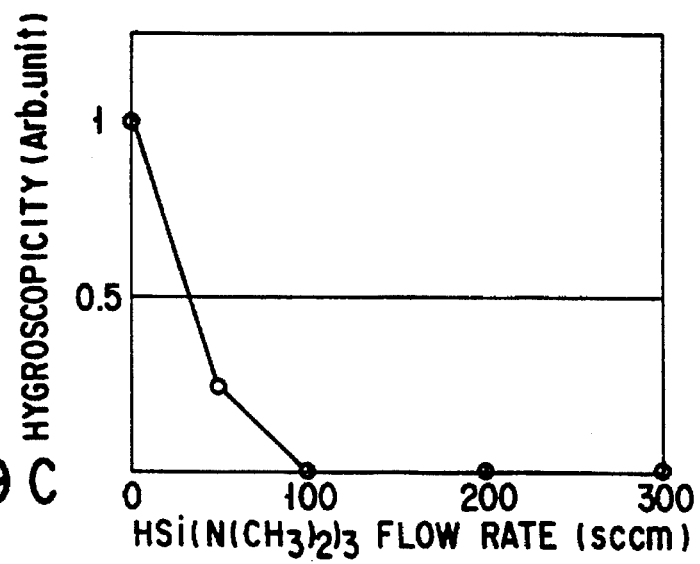
F I G. 9C

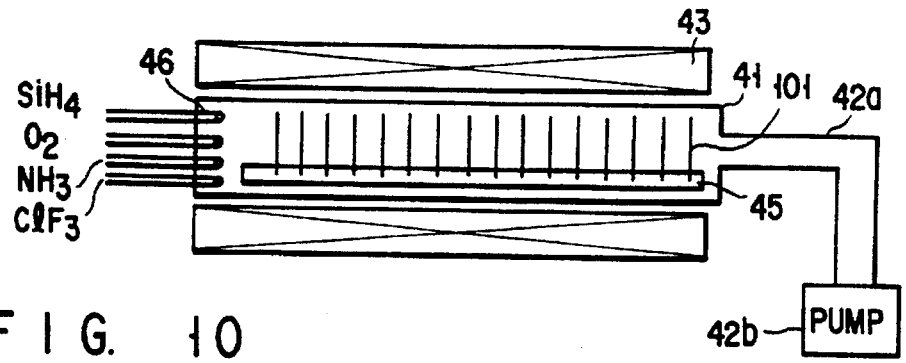
F I G. 10
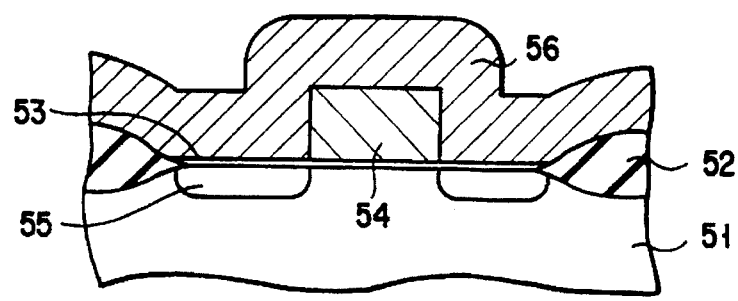
F I G. 11A
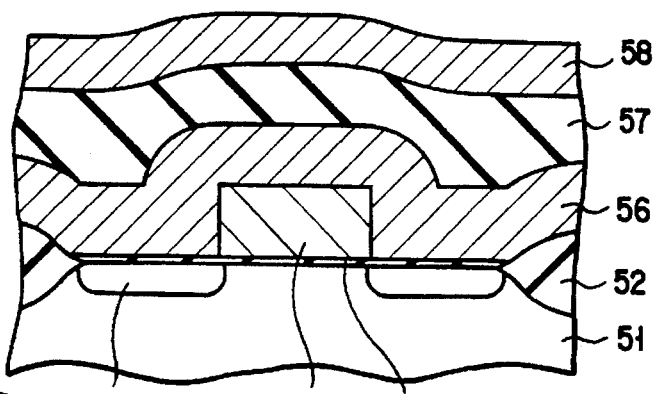
F I G. 11B
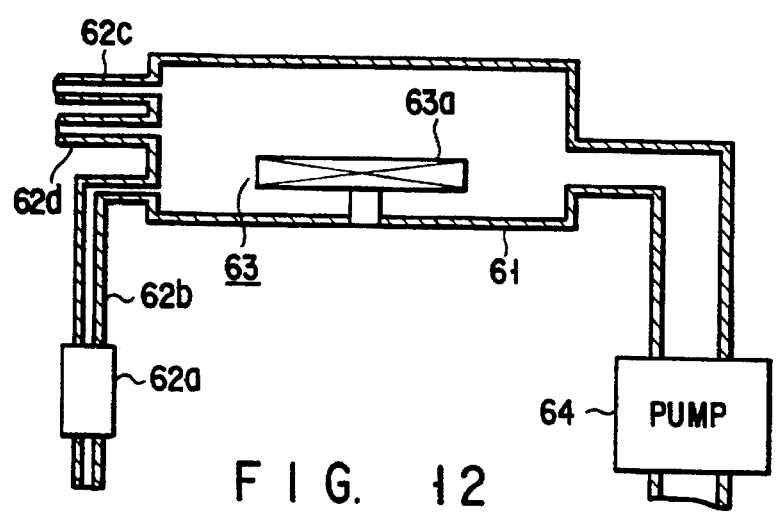
F I G. 12

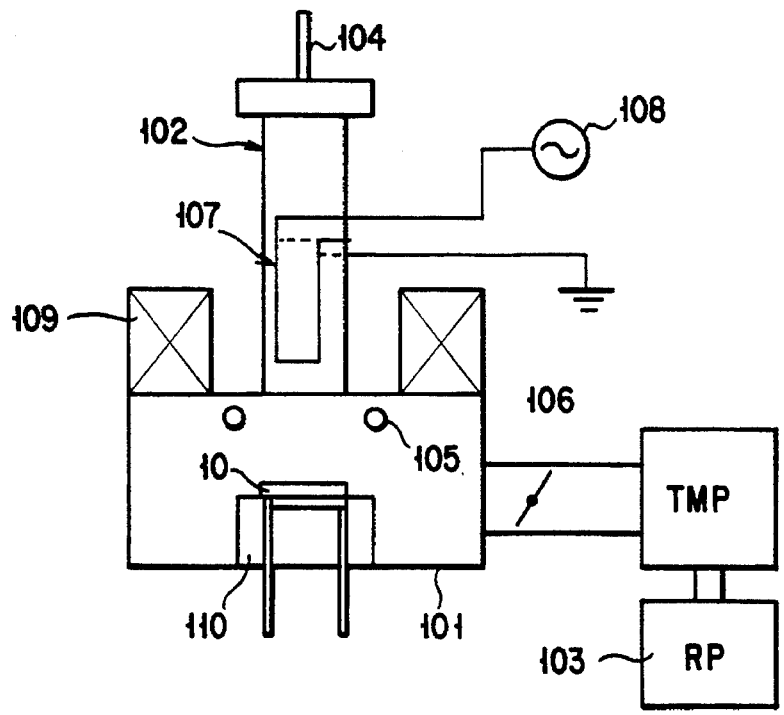
F I G. 17
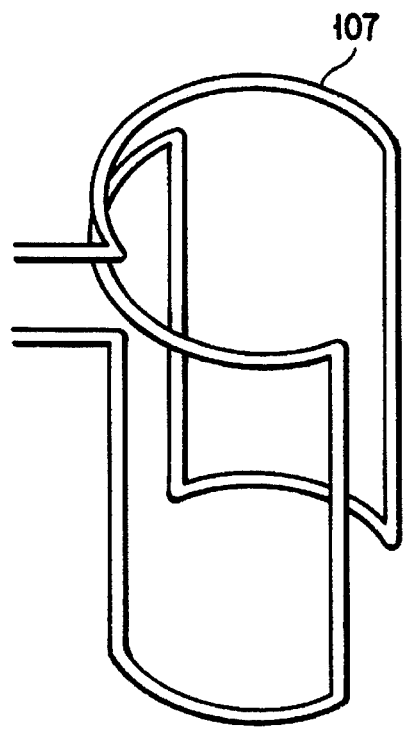
F I G. 18

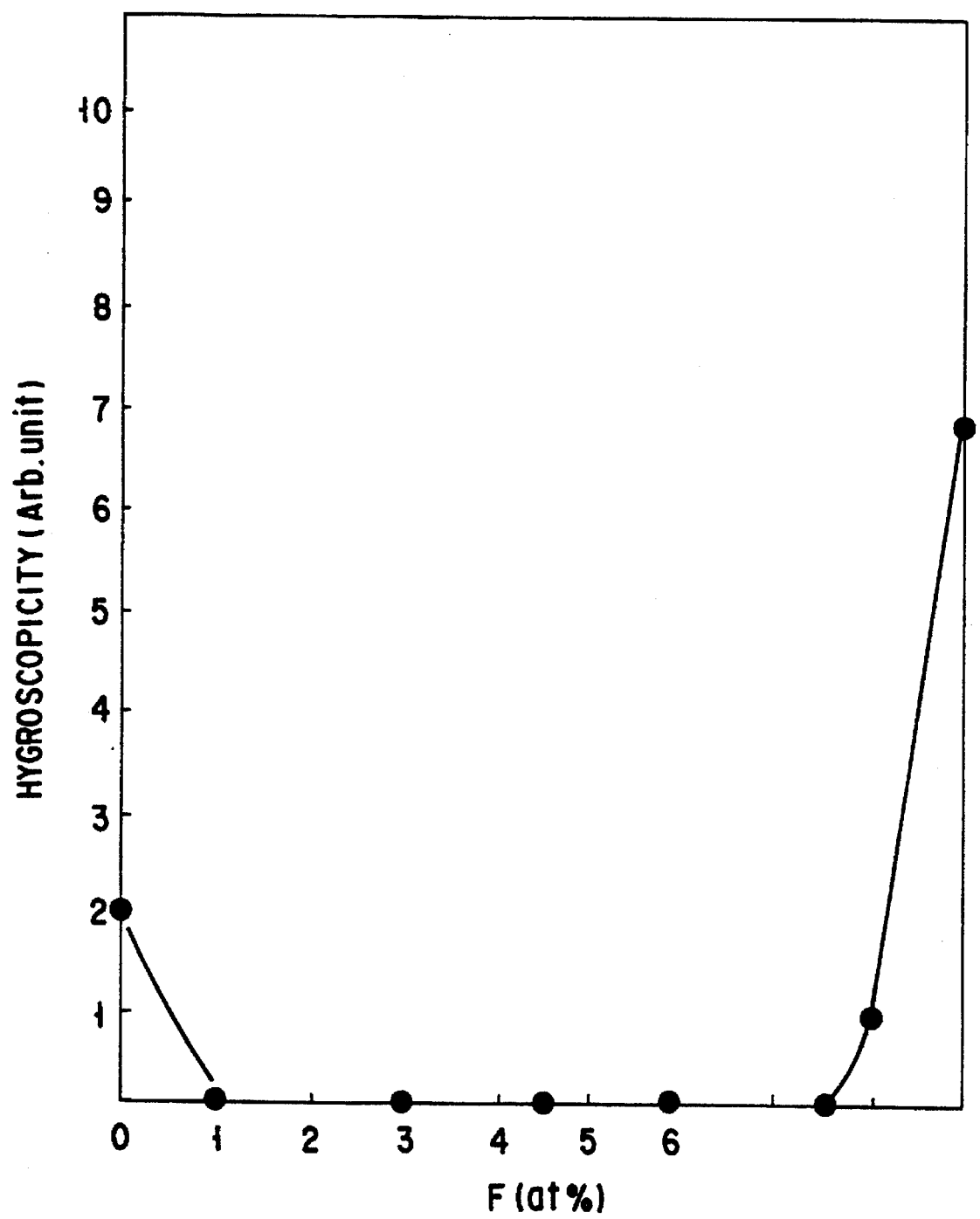
F I G. 19

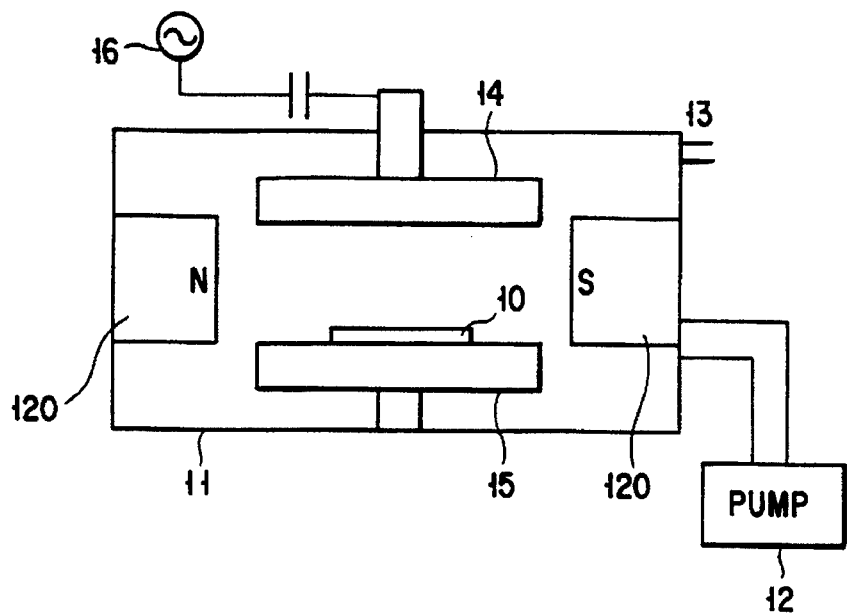
F I G. 20
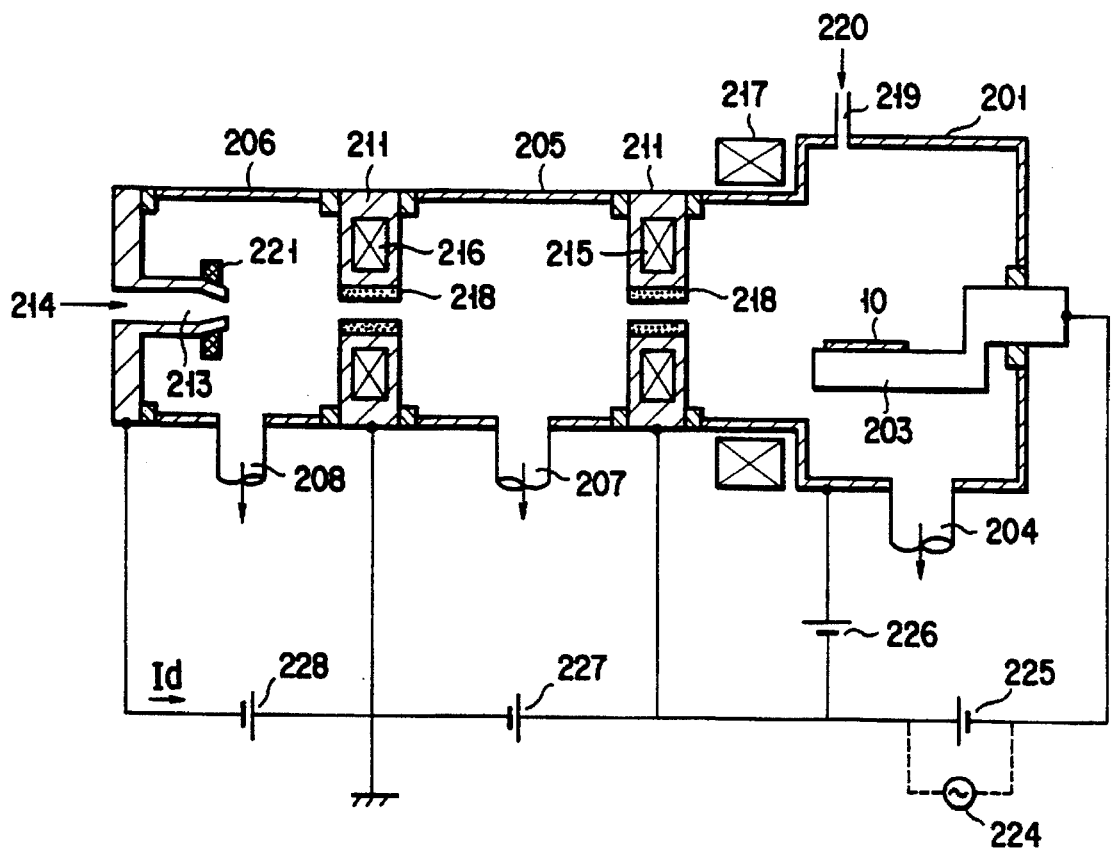
F I G. 21

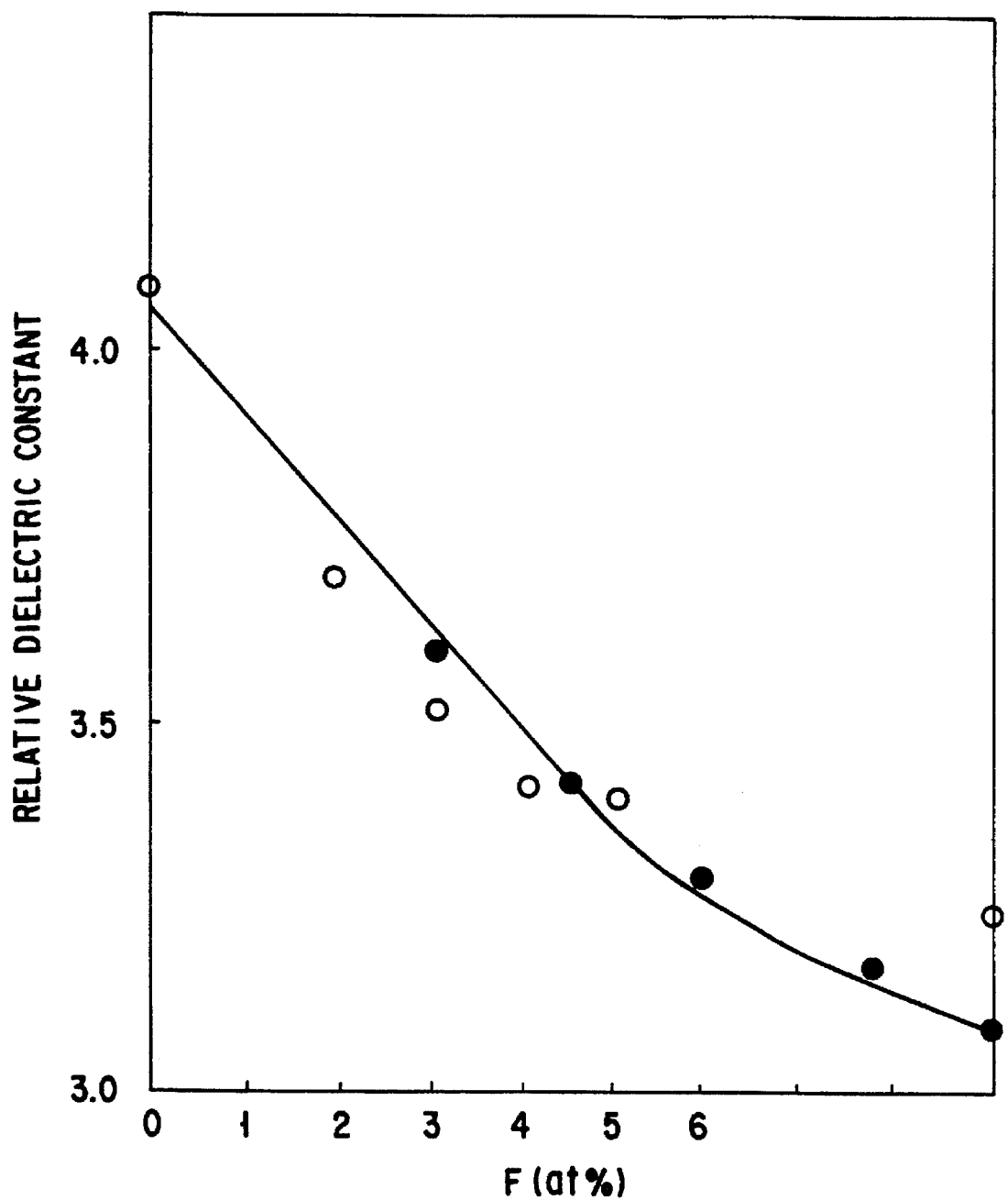
F I G. 22

SEMICONDUCTOR DEVICE

This is a Division, of application Ser. No. 08/094,423 filed on Jul. 16, 1993 now U.S. Pat. No. 5,429,995.

BACKGROUND OF THE INVENTION

1. Field of the Invention

The present invention relates to a semiconductor device and a method of manufacturing the same. Particularly, the present invention is directed to a method of forming an insulating film for isolating a wiring layer.

2. Description of the Related Art

An insulating film for electrically isolating an element wiring is used in a semiconductor device. It was customary in the past to use as an insulating film a $SiO_2$ film formed by thermal oxidation of a Si substrate or a $SiO_2$ film formed by chemical vapor deposition under a reduced pressure or atmospheric pressure using gaseous materials such as silane and tetraethoxy silane (TEOS). For insulation of, particularly, Al wirings, used is a $SiO_2$ film formed by plasma CVD using TEOS and $O_2$ because the $SiO_2$ film can be formed under such a low temperature as about 400° C.

In recent years, delay of signal transmission, which accompanies the miniaturization of the element, has come to be worried about. To be more specific, the interval between two adjacent wirings is shortened in accordance with miniaturization of the element, leading to an increased capacitance between the wirings and, thus, to the delay in the signal transmission. The delayed signal transmission obstructs a high operating speed of the semiconductor device so as to give rise to one of the causes of inhibiting the performance improvement of the semiconductor device. It follows that it is important to diminish the dielectric constant of the insulating film interposed between the two adjacent wirings. The $SiO_2$ film formed by the conventional plasma CVD method has been found to have a relative dielectric constant of 4.0 to 5.0. This makes it interesting to introduce F into $SiO_2$ in an attempt to lower the dielectric constant.

For example, it is described in Published Unexamined Japanese Patent Application No. 2-77127 that F is introduced into $SiO_2$ by means of ion implantation so as to lower the dielectric constant of $SiO_2$. In this method, however, it is necessary to set the dose of F at $1 \times 10^{19}$ atoms $cm^{-3}$ or more, giving rise to the problem that the ion implantation takes a long time. In addition, it is necessary to apply a heat treatment at such a high temperature as at least 600° C. in order to stabilize F within the $SiO_2$ layer. It follows that the $SiO_2$ layer formed by the method disclosed in this prior art cannot be used for the electric isolation of Al wirings.

A CVD method under room temperature, which uses $FSi(OC_2H_5)_3$ and $H_2O$, is reported in, for example, "T. Homma et al., IEEE IEDM, pp. 289 (1991)". In this method, however, it is difficult to control the F concentration in $SiO_2$. In addition, a serious difficulty is brought about that the formed $SiO_2$ film is highly hygroscopic.

Also known is a method in which an aqueous solution of boric acid is added to a supersaturated aqueous solution of $H_2SiF_6$ so as to utilize the reaction given below for forming a $SiO_2$ film:

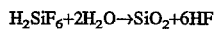

$$H_2SiF_6 + 2H_2O \rightarrow SiO_2 + 6HF$$

It is reported in Published Unexamined Japanese Patent Application No. 3-97247 that 5 at % of F is contained in the $SiO_2$ film formed by the method noted above, with the result that the relative dielectric constant of the $SiO_2$ film is rendered smaller than 3.9, which is the specific dielectric constant of a $SiO_2$ film formed by thermal oxidation. In this method, however, it is difficult to control the F concentration in the $SiO_2$ film. In addition, the growing rate of the $SiO_2$ film is as low as about 1 nm/min.

Further, a method of improving the step coverage of a $SiO_2$ film by using tetraethoxy silane (TEOS), $O_2$ and $NF_3$ as source gases is disclosed in "Proc. 2nd Int. ULSI Science and Tech. Symp. ECS Proc. (1989)", though the dielectric constant and hygroscopic property of the $SiO_2$ film are not referred to at all in this publication.

As described above, where the interval between two adjacent wirings is diminished in accordance with miniaturization of the element, the capacitance between these wirings is increased so as to bring about the problem that the signal transmission is delayed. To overcome the difficulty, it is proposed to introduce F into the $SiO_2$ insulating film so as to lower the dielectric constant of the insulating film. In the prior art, however, it is difficult to control accurately the F concentration in the $SiO_2$ film. It is also difficult to enable the F-containing $SiO_2$ film to be less hygroscopic.

SUMMARY OF THE INVENTION

An object of the present invention is to provide a method of forming a $SiO_2$ film which has a dielectric constant smaller than that of the $SiO_2$ film formed by the conventional plasma CVD method and is less hygroscopic.

According to the present invention, there is provided a method of manufacturing a semiconductor device, in which a silicon oxide film containing fluorine, said film acting as an insulating film for electrically isolating conductive layers included in a semiconductor device, is formed by a plasma CVD method using an organic silane gas containing fluorine.

The organic silane gas containing F, which is used in this method, has a Si—F bond. Such an organic silane gas is represented by formula: $FSi(OR)_3$, where R is alkyl group. For example, $FSi(OC_2H_5)_3$ or $FSi(OCH_3)_3$ is used as a desirable organic silane gas. The organic silane gas containing F can be used singly or in combination with at least one of gases selected from the group consisting of an oxidizing gas and another gaseous compound containing F.

The oxidizing gas used in this method includes, for example, $O_2$ and $N_2O$.

The other gaseous compound containing F includes, for example, $NF_3$, $CF_4$, $CClF_3$, $C_2F_6$, $SiF_4$, $SiH_3F$, $SiH_2F_2$ and $SiHF_3$.

In this method, it is desirable to use a plasma generated by using a plurality of high frequency powers differing from each other in frequency. Two high frequency powers, for example, having a frequency of 13.56 MHz and another frequency not higher than 1 MHz, respectively, can be used preferably.

According to the present invention, there is provided other method of manufacturing a semiconductor device, in which a silicon oxide film containing fluorine and at least one of nitrogen and carbon, said film acting as an insulating film for electrically isolating conductive layers included in a semiconductor device, is formed by a CVD method using a source gas containing fluorine and at least one of nitrogen and carbon.

In this method, at least one gas selected from a group consisting of, for example, $HSi(N(CH_2)_2)_3$, $Si(N(CH_3)_2)_4$, $(CH_3)_3SiN_3$, $NH_3$, $N_2$, NO and $N_2O$ as a source gas containing N. A $FSi(N(CH_3)_2)_3$ gas may be used as a source gas containing F and N. The source gas selected from abovementioned organic silane gas containing F, oxidizing gas and another gaseous compound containing F may be used with the source gas containing N.

It is desirable for the silicon oxide film formed in this method to have a F concentration of at least 3 atomic % and a N concentration of at least 1 atomic %.

According to the present invention, there is provided another method of manufacturing a semiconductor device, in which a silicon oxide film containing fluorine, said film acting as an insulating film for electrically isolating conductive layers included in a semiconductor device, is formed by a plasma CVD method using a source gas containing at least silicon, oxygen and fluorine, under the conditions that the relationship between the gas pressure P (Torr) and the ion energy E (eV) satisfies formula A given below:

$$P \geq 5 \times 10^{-4}, P \leq 10^{-1} \times 10^{-E/45} \quad (A)$$

and the relationship between the ion energy E (eV) and the plasma density D (/cm$^3$) satisfies the formula B given below:

$$P \geq 2 \times 10^{11} \times 10^{-E/45}, 10 \leq E \quad (B)$$

In this method, a magnetron plasma CVD, a helicon wave plasma CVD or an electron beam excited plasma CVD, which can provide a high plasma density, is used as a desirable plasma CVD method. The ion energy is preferably set to 100 eV or less.

According to this method, there is provided a semiconductor device, which comprises a silicon oxide film acting as an insulating film for electrically isolating conductive layers included in the semiconductor device, said silicon oxide film having a fluorine concentration of at least 1 at % and a Si dangling bond density of $10^{17}$ cm$^{-3}$ or less. The Si dangling bond density is preferably $10^{14}$ cm$^{-3}$ or less.

The SiO$_2$ film formed by the method of the present invention has a low dielectric constant. It is considered reasonable to understand that, if Si—F bond is formed as a result of F addition to SiO$_2$, the Si—O network structure is broken to lower the density, leading to a smaller dielectric constant. It follows that the capacitance between adjacent wirings can be lowered, making it possible to suppress the delay in the signal transmission and, thus, to achieve a high operating speed of the element. What should also be noted is that, in the method of the present invention, the F concentration in the SiO$_2$ film can be easily controlled by controlling the flow rate of the source gas.

It is considered reasonable to understand that, where the SiO$_2$ film contains both F and N, a Si—F bond and a Si—N bond are formed together, with the result that a high density portion and a low density portion are formed together in the SiO$_2$ film. It follows that the dielectric constant of the SiO$_2$ film is lowered, making it possible to form an insulating film smaller in moisture absorption. The similar effect can be obtained where C is contained in place of N contained in the SiO$_2$ film.

In forming a SiO$_2$ film containing F, it is desirable to apply a plurality of high frequency powers differing from each other in frequency to an organic silane containing F, which is used as a source gas, so as to generate a plasma. In this case, the F concentration can be increased by lowering the RF power, with the result that the gate breakage caused by charged particles is unlikely to take place. In addition, the formed SiO$_2$ film is enabled to be much lower in its moisture absorption.

Also, a silicon oxide film containing fluorine is formed by a plasma CVD method under the conditions that the relationship between the gas pressure P (Torr) and the ion energy E (eV) satisfies formula A given below:

$$P \geq 5 \times 10^{-4}, P \leq 10^{-1} \times 10^{-E/45} \quad (B)$$

and the relationship between the ion energy E (eV) and the plasma density D (/cm$^3$) satisfies the formula B given below:

$$D \geq 2 \times 10^{11} \times 10^{-E/45}, 10 \leq E \quad (B)$$

The particular method of the present invention permits the formed SiO$_2$ film containing F to be less likely to absorb moisture. It should be noted that a large number of active F radicals and C radicals are present in the plasma formed under the conditions described above. In this case, the density of the Si dangling bonds within the silicon oxide film, said Si dangling bond providing the reaction site with water, is decreased to $10^{17}$ cm$^{-3}$ or less, leading to the low moisture absorption noted above. This effect can be observed for a silicon oxide film having a fluorine concentration of 1 at % or more, particularly from 3 to 8 at %.

BRIEF DESCRIPTION OF THE DRAWINGS

FIG. 1 shows the construction of a plasma CVD apparatus used in Example 1;

FIGS. 2A to 2C are cross sectional views showing the steps of manufacturing a semiconductor device in Example 1;

FIG. 4 is a graph showing the relationship between the flow rate of a NF$_3$ gas and the Si—F absorption peak area observed at a wave number of 940 cm$^{-1}$;

FIG. 5 is a graph showing the relationship between the F concentration in the SiO$_2$ film and the relative dielectric constant of the SiO$_2$ film;

FIG. 6 is a graph showing the relationship between the F concentration in the SiO$_2$ film and the hygroscopicity of the SiO$_2$ film;

FIG. 7 is a graph showing the relationship between the F concentration in the SiO$_2$ film and the leakage current in the case where a constant voltage is applied across a MOS capacitor;

FIGS. 9A to 9C are graphs each showing the properties of the SiO$_2$ film formed in Example 3 of the present invention;

FIG. 10 shows the construction of a deposition apparatus used in Example 4 of the present invention;

FIGS. 11A and 11B are cross sectional views showing the steps of manufacturing a semiconductor device in Example 4 of the present invention;

FIG. 12 shows the construction of a deposition apparatus used in Example 5 of the present invention;

FIG. 17 shows the construction of a deposition apparatus used in Example 7 of the present invention;

FIG. 18 is an oblique view showing the discharge antenna included in the deposition apparatus used in Example 7 of the present invention;

FIG. 19 is a graph showing the relationship between the F concentration in the $SiO_2$ film formed in Example 7 of the present invention and the hygroscopicity of the $SiO_2$ film;

FIG. 20 shows the construction of a deposition apparatus used in Example 8 of the present invention;

FIG. 21 shows the construction of a deposition apparatus used in Example 9 of the present invention;

FIG. 22 is a graph showing the relationship between the F concentration in the $SiO_2$ film and the relative dielectric constant of the $SiO_2$ film;

DETAILED DESCRIPTION OF THE PREFERRED EMBODIMENTS

Figure 3:
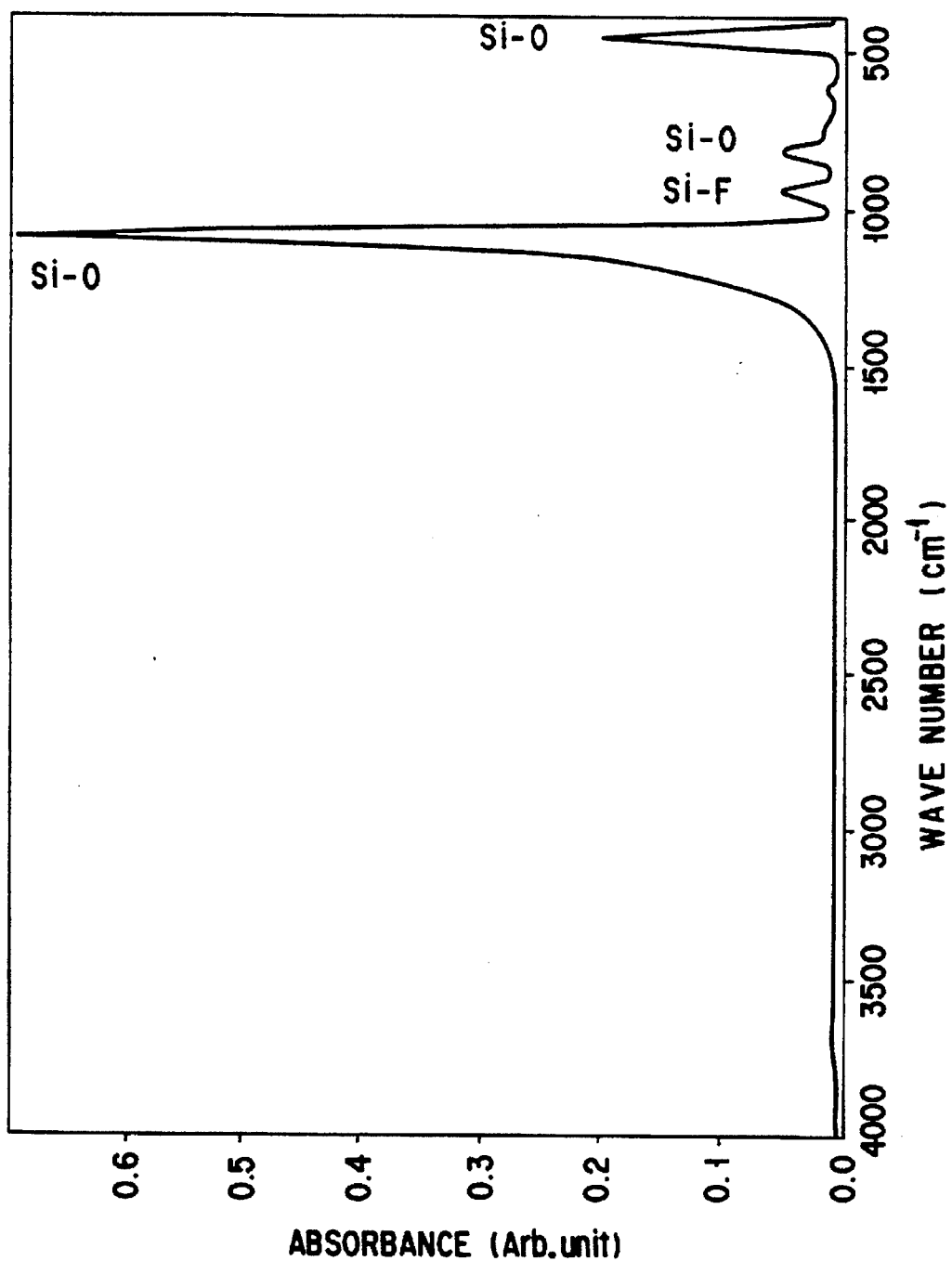
FIG. 3 shows an infrared absorption spectrum of the SiO$_2$ film containing a Si—F bond formed in Example 1.

Let us describe some Examples of the present invention.

EXAMPLE 1

FIG. 1 shows a parallel plate type plasma CVD apparatus used in Example 1. As shown in the drawing, a gas within a chamber 11 is discharge to the outside by a pump 12. Reaction gases are introduced into the chamber 11 through quartz nozzles 13. Parallel plate type electrodes 14 and 15 are arranged in parallel within the chamber 11. A high frequency power source 16 is connected to the electrode 14 via a matching box, with the electrode 15 being connected to a ground potential point. A Si substrate 10 is mounted on the electrode 15.

FIGS. 2A to 2C are cross sectional views showing as an example the process of forming an interlayer insulating film using TEOS, $O_2$ and $NF_3$ gases as the source gases.

In the first step, the Si substrate 10 is mounted on the electrode 15, followed by heating the substrate 10° to 400° C. with a resistance heater. Under this condition, a tetraethoxy silane (TEOS) gas, an $O_2$ gas and a $NF_3$ gas are simultaneously introduced into the chamber 11 at flow rates of 50 sccm, 500 sccm and 0 to 500 sccm, respectively, so as to set up a pressure of 5 Torr within the chamber 11. Also, 13.56 MHz of RF power is supplied to the electrode 14 so as to cause discharge and, thus, to form a $SiO_2$ film 22 having a thickness of 500 nm on the Si substrate 21, as shown in FIG. 2A. In the next step, an Al film is formed in a thickness of 400 nm by means of a DC magnetron sputtering, followed by patterning the Al film to form a first Al wiring 23 having a width of 500 nm and a height of 400 nm, as shown in FIG. 2B. Then, a $SiO_2$ film 24 is formed in a thickness of 800 nm as shown in FIG. 2C. The $SiO_2$ film 24 is formed as in the formation of the $SiO_2$ film 22. Further, an Al film having a thickness of 400 nm is formed to cover the second $SiO_2$ film 24, followed by patterning the Al film to form a second Al wiring 25, as in the formation of the first Al wiring 23. Finally, a $SiO_2$ film 26 having a thickness of 800 nm is formed to cover the second Al wiring 25 as in the formation of the $SiO_2$ film 22 or 24.

FIG. 3 shows an infrared absorption spectrum of the $SiO_2$ film formed under the condition that the $NF_3$ flow rate was set at 150 sccm. As shown in FIG. 3, peaks derived from the Si—O bond are found at the wave numbers of 1080 $cm^{-1}$, 810 $cm^{-1}$ and 450 $cm^{-1}$. Also found at the wave number of about 940 $cm^{-1}$ is a peak derived from Si—F bond. Clearly, the infrared absorption spectrum shown in FIG. 3 indicates the formation of a $SiO_2$ film having a Si—F bond.

FIG. 4 shows the relationship between the flow rate of the $NF_3$ gas and the Si—F absorption peak area observed at a wave number of 940 $cm^{-1}$ in respect of the $SiO_2$ films formed by changing the $NF_3$ gas flow rates in various fashions. It is clearly seen that the Si—F bond within the $SiO_2$ film is increased with increase in the flow rate of the $NF_3$ gas. Measured was the fluorine amount within the $SiO_2$ film formed by changing the $NF_3$ gas flow rate in various fashions. The F concentration was found to be about 2 atomic % where the flow rate of the $NF_3$ gas was set at 50 sccm, about 3 atomic % where the flow rate of the $NF_3$ gas was set at 100 sccm, about 4 atomic % where the flow rate of the $NF_3$ gas was set at 150 sccm, and about 5 atomic % where the flow rate of the $NF_3$ gas was set at 200 sccm.

Further, measured were C—V characteristics of a capacitor consisting of a $SiO_2$ film formed by changing the flow rate of the $NF_3$ gas in various fashions and an Al film patterned to have an area of about 0.1 $mm^2$ so as to obtain the relative dielectric constant of the $SiO_2$ film. FIG. 5 shows the relationship between the F concentration in the $SiO_2$ film and the relative dielectric constant of the $SiO_2$ film. It is clearly seen that the fluorine introduction into the $SiO_2$ film permits lowering the dielectric constant of the $SiO_2$ film. It should be noted, however, that the hygroscopicity of the $SiO_2$ film is sharply increased with increase in the F concentration in the $SiO_2$ film, as shown in FIG. 6.

FIG. 7 shows the relationship between the F concentration in the $SiO_2$ film and the leakage current which takes place when a predetermined voltage (electric field intensity of 3 MV/cm) is applied across the MOS capacitor.

As described above, where the F concentration is not high than 5 atomic %, the dielectric constant of the $SiO_2$ film is lowered so as to suppress the current leakage.

An additional experiment was conducted to form a $SiO_2$ film by the method equal to that described above, except that $SiH_4$, $N_2O$ and $NF_3$ used as source gases were introduced into the chamber 11 at flow rates of 50 sccm, 500 sccm and 0 to 500 sccm, respectively, in place of TEOS, $O_2$ and $NF_3$ used in the experiment described previously, and that the film-forming pressure was set at 1 Torr. It has been confirmed that, where the F concentration in the $SiO_2$ film is not higher than 5 atomic %, the dielectric constant of the $SiO_2$ film is lowered and the leak current is suppressed.

In the method of the present invention, it is possible to use organic silane gases such as $HSi(OC_2H_5)_3$ and $H_2Si(C_4H_9)_2$ in place of TEOS. Further, it is possible to use gaseous F-containing compounds such as $CF_4$, $CClF_3$ and $SiF_4$ in place of $NF_3$.

An additional experiment was conducted to form a $SiO_2$ film by the method equal to that described above, except that $FSi(OC_2H_5)_3$ and $O_2$ used as source gases were introduced into the chamber 11 at flow rates of 50 sccm and 500 sccm, respectively, in place of TEOS, $O_2$ and $NF_3$ used in the experiment described previously, and that the film-forming pressure was set at 1 Torr. It has been confirmed that the F concentration in the $SiO_2$ film was 5 atomic %, that the relative dielectric constant of the $SiO_2$ film was about 3.4, and that the leakage current was much suppressed. In this case, it is also possible to control the F concentration in the $SiO_2$ film by controlling the $O_2$ flow rate or the discharge power.

A similar effect can also be obtained in the case of using a mixed gas comprising an organic silane gas containing no fluorine and an organic silane gas containing fluorine, for example, $FSi(OC_2H_5)_2$, $O_2$ and TEOS. In this case, the F concentration in the $SiO_2$ film can be controlled without difficulty by changing the ratio of the flow rate of $FSi(OC_2H_5)_2$ to the flow rate of TEOS. It is also possible to form a $SiO_2$ film having a Si—F bond by using a $FSi(OC_2H_5)_2$ gas alone or both $FSi(OC_2H_5)_2$ gas and TEOS gas without using the oxidizing agent of $O_2$. Further, it is possible to use F-containing gaseous inorganic silane compounds such as $SiH_3F$, $SiH_2F_2$ and $SiHF_3$ in place of the $FSi(OC_2H_5)_2$ gas.

EXAMPLE 2

The present invention covers the case where a F-containing $SiO_2$ film and a $SiO_2$ film which does not contain F are laminated one upon the other as shown in FIG. 8. An insulating film of such a laminate structure permits markedly suppressing the moisture absorption so as to improve the reliability of the metal wiring.

Figure 8A:
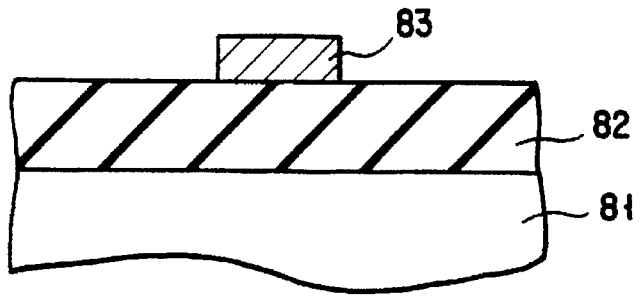
FIGS. 8A to 8D are cross sectional views showing the steps of manufacturing a semiconductor device in Example 2 of the present invention.

As shown in FIG. 8A, a BPSG (borophosphosilicate glass) film 82 having a thickness of 800 nm is formed first on a Si substrate 81, followed by forming an Al wiring 83 having a width of 500 nm and a height of 400 nm on the BPSG film 82.

Figure 8B:
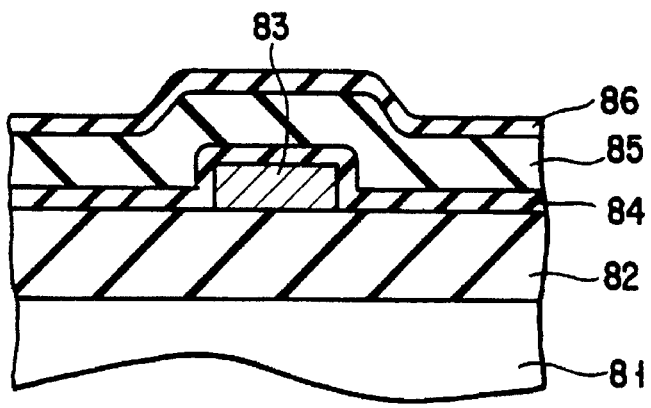

As shown in FIG. 8B, a $SiO_2$ film 84, which does not contain fluorine, is formed in a thickness of 100 nm to cover the Al wiring 83 and the exposed surface of the BPSG film 82 by using TEOS and $O_2$ as source gases. Further, a $SiO_2$ film 85 containing F is formed in a thickness of 500 nm to cover the $SiO_2$ film 84 by using TEOS, $O_2$ and $NF_3$ as source gases, as in Example 1, followed by further forming a $SiO_2$ film 86, which does not contain F, in a thickness of 100 nm to cover the $SiO_2$ film 85 using TEOS and $O_2$ as source gases.

Figure 8C:
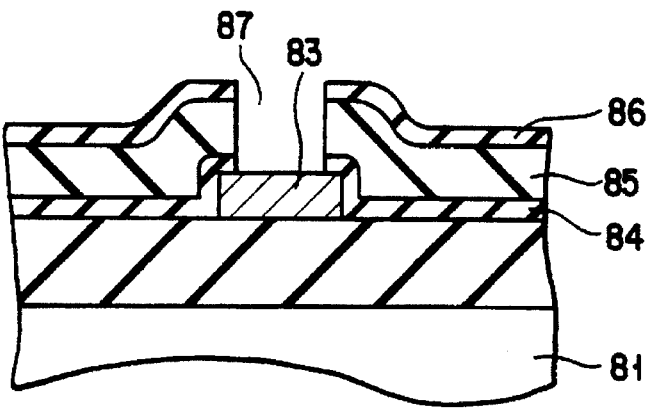

In the next step, the $SiO_2$ film 86 is coated with photoresist, followed by exposure to light and, then, development. Further, a hole 87 is formed in the laminate structure of the $SiO_2$ films positioned above the Al wiring 83 as shown in FIG. 8C.

Further, the hole 87 is filled with a tungsten layer 88 by means of a selective CVD method using $WF_6$ and $SiH_4$, followed by forming an Al film by a sputtering method and subsequently patterning the Al film so as to form an Al wiring 89. After formation of the Al wiring 89, a $SiO_2$ film 810 which does not contain fluorine is formed in a thickness of 100 nm, followed by forming a $SiO_2$ film 811 containing fluorine in a thickness of 500 nm on the $SiO_2$ film 810 and subsequently forming a $SiO_2$ film 812 which does not contain fluorine in a thickness of 100 nm on the $SiO_2$ film 811, as in the step shown in FIG. 8B.

Figure 8D:
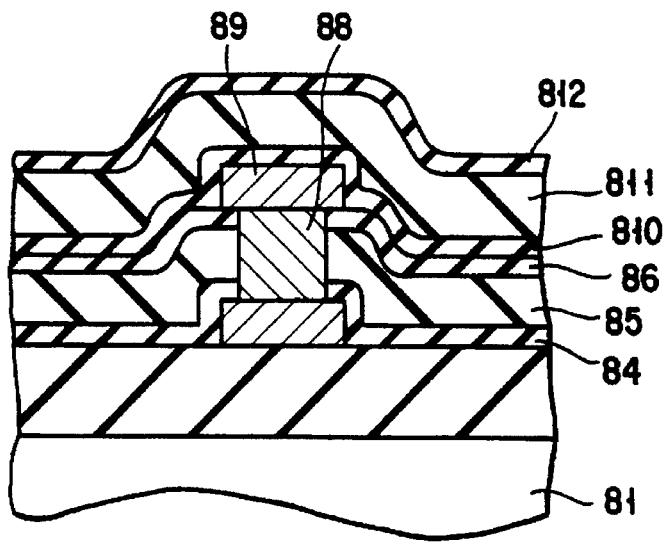

It should be noted that the $SiO_2$ film, which does not contain fluorine, is lower in its hygroscopicity than the $SiO_2$ film containing fluorine. It follows that the metal wiring included in the semiconductor device shown in FIG. 8D is unlikely to contact the moisture absorbed by the $SiO_2$ film.

EXAMPLE 3

In the present invention, it is possible to form an interlayer insulating film for a multi-layer wiring as in FIG. 2 by using a parallel plate type plasma CVD apparatus as shown in FIG. 1. Used in this example as source gases are a $HSi(N(CH_3)_2)_3$ gas, a $FSi(OC_2H_5)_3$ gas and an $O_2$ gas.

In the first step, the substrate 10 is mounted on the electrode 15, and the substrate 10 is heated to 400° C. by a resistance heater. Then, a $HSi(N(CH_3)_2)_3$ gas, a $FSi(OC_2H_5)_3$ gas and an $O_2$ gas, which are used as source gases, are introduced into the reaction chamber 11 at flow rates of 50 sccm, 500 sccm and 0 to 300 sccm, respectively. Also, the film-forming pressure is set at 5 Torr. Under this condition, an RF power of 13.56 MHz is applied to the electrode 14 so as to convert the source gases into a plasma and, thus, to form a $SiO_2$ film containing F and N on the Si substrate 21, as shown in FIG. 2A. The $SiO_2$ film is formed in a thickness of 500 nm in this step.

In the next step, an Al film is formed in a thickness of 400 nm by means of a DC magnetron sputtering method, followed by patterning the Al film so as to form a first Al wiring 23 having a width of 500 nm and a height of 400 nm, as shown in FIG. 2B. Further, a $SiO_2$ film is formed in a thickness of 800 nm by using source gases equal to those used in the previous step, as shown in FIG. 2C. Still further, an Al film is formed in a thickness of 400 nm, followed by patterning the Al film to form a second Al wiring 25 as in the formation of the first Al wiring 23. Finally, a $SiO_2$ film 26 is formed in a thickness of 800 nm using the same source gases.

FIG. 9A is a graph showing the relationship between the flow rate of the $HSi(N(CH_3)_2)_3$ gas and the N and F concentrations in the $SiO_2$ film. It is seen that the N concentration is increased with increase in the flow rate of the $HSi(N(CH_3)_2)_3$ gas. However, the F concentration remains constant regardless of the flow rate of the $HSi(N(CH_3)_2)_3$ gas.

FIG. 9B is a graph showing the relationship between the flow rate of the $HSi(N(CH_3)_2)_3$ gas and the relative dielectric constant of the $SiO_2$ film. It is seen that the relative dielectric constant of the $SiO_2$ film is 3.4 where the flow rate of the $HSi(N(CH_3)_2)_3$ gas is 0 sccm. However, the density of the $SiO_2$ film is gradually increased with increase in the N concentration, leading an increase in the relative dielectric constant of the $SiO_2$ film.

FIG. 9C is a graph showing the relationship between the flow rate of the $HSi(N(CH_3)_2)_3$ gas and the hygroscopicity of the $SiO_2$ film. It is seen that the nitrogen introduction into the $SiO_2$ film permits lowering the hygroscopicity of the $SiO_2$ film.

As apparent from FIGS. 9A to 9C, a $SiO_2$ film containing F and N, which has a relative dielectric constant of 3.5 and is low in hygroscopicity, can be formed by setting the flow rate of the $HSi(N(CH_3)_2)_3$ gas at 100 sccm.

It is possible to use organic silane gases containing nitrogen such as $Si(N(CH_3)_2)_4$ and $(CH_3)_3SiN_3$ in place of the $HSi(N(CH_3)_2)_3$ gas. It is also possible to use inorganic silane gases containing fluorine such as $SiH_3F$, $SiH_2F_2$, $SiHF_3$ and $SiF_4$ in place of the organic silane gas such as $FSi(OC_2H_5)_3$. Further, other oxidizing agents such as $N_2O$ and $O_3$ can be used in place of the $O_2$ gas.

An additional experiment was conducted to form a $SiO_2$ film by the method equal to that described above in the temperature and pressure conditions, except that $NH_3$ gas and $FSi(OC_2H_5)_3$ gas, which were used as source gases were introduced into the chamber 11 at the flow rate of 50 sccm for each of these source gases, in place of $HSi(N(CH_3)_2)_3$ gas and the $FSi(OC_2H_5)_3$ gas used in the experiment described previously. It has been confirmed that it is possible to form a $SiO_2$ film containing both F and N, which has a relative dielectric constant of 3.5 and is low in its hygroscopicity.

A still additional experiment was conducted to form a $SiO_2$ film by the method equal to that described above in the temperature and pressure conditions, except that a $HSi(N(CH_3)_2)_3$ gas and a $NF_3$ gas, which were used as source gases in place of the $HSi(N(CH_3)_2)_3$ gas and the $FSi(OC_2H_5)_3$ gas used in the experiment described previously, were introduced into the reaction chamber at the flow rates of 100 sccm and 50 sccm, respectively. It has been confirmed that it is possible to form a $SiO_2$ film containing both F and N, which has a relative dielectric constant of 3.5 and is low in its hygroscopicity. Similar effects can also be obtained in the cases where F-containing gaseous compounds such as $CF_4$ and $ClF_3$ are used in place of the $NF_3$ gas.

EXAMPLE 4

Used in this example is a hot wall type batch thermal CVD apparatus shown in FIG. 10, and a $SiO_2$ film is formed by using a $NH_3$ gas, a $CClF_3$ gas, a $SiH_4$ gas and an $O_2$ gas as source gases.

As shown in FIG. 10, a discharge pump 42b is connected to a discharge port 42a of a quartz tube 41, and a resistance heater 43 is arranged to surround the quarts tube 41. A quartz boat 45 is disposed within the quartz tube 41, and a plurality of Si substrates 10 are arranged on the quartz boat 45 in the flowing direction of the gases. The Si substrate 10 can be heated to 600° to 700° C. by the resistance heater 43. On the other hand, a plurality of quartz nozzles 46 for introducing source gases into the quartz tube 41 are mounted on the inlet side of the quartz tube 41 opposite to the discharge port 42a.

Let us describe how to form a thermal CVD oxide film on the gate electrode by using the apparatus described above. FIGS. 11A and 11B are cross sectional views showing the steps for forming a $SiO_2$ film. In this case, it is possible to form a $SiO_2$ film containing both F and N, which has a relative dielectric constant of 3.5 and is low in its hygroscopicity.

In the first step, an element isolation region 52 is formed on a Si substrate 51, followed by forming a gate oxide film 53, a polycrystalline silicon gate 54 and regions 55 doped with an impurity and subsequently forming a $SiO_2$ film 56 in a thickness of 300 nm to cover the entire surface, as shown in FIG. 11A. In forming the $SiO_2$ film 56, an $NH_3$ gas, a $CClF_3$ gas, a $SiH_4$ gas, and an $O_2$ gas are introduced into the reaction chamber at flow rates of 1000 sccm, 100 sccm, 500 sccm and 100 sccm, respectively, and the $SiO_2$ film 56 is formed at a temperature of 700° C. and a pressure of 0.4 Torr.

In the next step, a BPSG film 57 is formed in a thickness of 500 nm as shown in FIG. 11B. In this case, the BPSG film 57 is heated to 850° C. to bring about a melt re-flow, followed by forming another $SiO_2$ film 58 as in the formation of the $SiO_2$ film 56. In this embodiment, it is possible to diminish the capacitance between the gate and an upper wiring (not shown) so as to suppress the delay in the signal transmission.

It is possible to use other gaseous F-containing compounds such as $NF_3$ and $CF_4$ in place of the $CClF_3$ gas.

It is also possible to use organic silane gases such as TEOS, $HSi(OC_2H_5)_3$ and $H_2Si(C_4H_9)_2$ in place of the $SiH_4$ gas, with substantially the same effect.

It is also possible to use a mixed gas consisting of an N-containing silane gas, an F-containing silane gas and an $O_2$ gas as an oxidizing gas in place of the $NH_3$ gas, $CClF_3$ gas, $SiH_4$ gas and $O_2$ gas referred to above, with substantially the same effect. The N-containing silane gas noted above includes, for example, $HSi(N(CH_3)_2)_3$, $Si(N(CH_3)_2)_4$, and $(CH_3)_3SiN_3$. On the other hand, the F-containing silane gas noted above includes, for example, $SiH_3F$, $SiH_2F_2$, $SiHF_3$, $SiF_4$, and $FSi(OC_2H_5)_3$.

An additional experiment was conducted. In this case, an $NH_3$ gas, a $FSi(OC_2H_5)_3$ gas and an $O_2$ gas were introduced into the reaction chamber at the flow rate of 50 sccm for each of these gases, and a $SiO_2$ film was formed under the same temperature and pressure conditions as above. The $SiO_2$ film thus formed was found to contain both F and N, to have a relative dielectric constant of 3.5, and to be lower in its hygroscopicity.

A still additional experiment was conducted. In this case, an $HSi(N(CH_3)_2)_3$ gas, a $CClF_3$ gas and an $O_2$ gas were introduced into the reaction chamber at the flow rates of 100 sccm, 50 sccm, and 50 sccm, respectively, and a $SiO_2$ film was formed under the same temperature and pressure conditions as above. The $SiO_2$ film thus formed was found to contain both F and N, to have a relative dielectric constant of 3.5, and to be lower in its hygroscopicity. It is also possible to use gaseous F-containing compounds such as $CF_4$ and $NF_3$ in place of the $CClF_3$ gas noted above.

EXAMPLE 5

In the present invention, it is possible to use a cold wall type thermal CVD apparatus of a batch system as shown in FIG. 12. Used in this example as source gases are a $NF_3$ gas, a TEOS gas and a $N_2O$ gas.

As shown in FIG. 12, an ozonizer 62a serving to convert oxygen into ozone by silent discharge is connected to a reaction chamber 61. An $NF_3$ gas and a $N_2O$ gas are introduced into the ozonizer 62a, with the result that oxygen in the $N_2O$ gas is converted into ozone, which is introduced into the reaction chamber 61 through a gas inlet pipe 62b. The apparatus also comprises gas inlet pipes 62c and 62d serving to introduce the $FSi(OC_2H_5)_3$ gas and the $HSi(N(CH_3)_2)_3$ gas into the reaction chamber 61 and a discharge pump 64. A sample holder 63 having a heater 63a buried therein is arranged within the reaction chamber 61.

In forming a $SiO_2$ film, an $NF_3$ gas, a TEOS gas and a $N_2O$ gas are introduced into the reaction chamber 61 at the flow rates of 200 sccm, 100 sccm and 1000 sccm, respectively. Under this condition, the substrate is heated by the heater 63a to 350° C., and a film-forming pressure is set at 5 Torr. The $SiO_2$ film thus formed, which contains both F and N, exhibits a re-flow shape, has a relative dielectric constant of 3.5, and is low in its hygroscopicity. In this case, it is possible to use other gaseous F-containing compounds such as $CF_4$ and $CClF_3$ in place of the $NF_3$ gas, with substantially the same effect.

As a result of an extensive research, the present inventor has found that, in Examples 3 to 5 described above, it is desirable to use a parallel plate type plasma CVD apparatus as shown in FIG. 1 and to use as a source gas a N-containing silane gas having a Si—N bond in the molecule such as $HSi(N(CH_3)_2)_3$, $Si(N(CH_3)_2)_4$ or $(CH_3)_2SiN_3$. It has been found that, in this case, it is possible to form a $SiO_2$ film having a low relative dielectric constant and a much lower hygroscopicity. It is considered reasonable to understand that the use of a source gas having a Si—N bond permits N to remain in the formed $SiO_2$ film with a high probability, even if dissociation of the source gas is promoted by plasma.

Figure 13A:
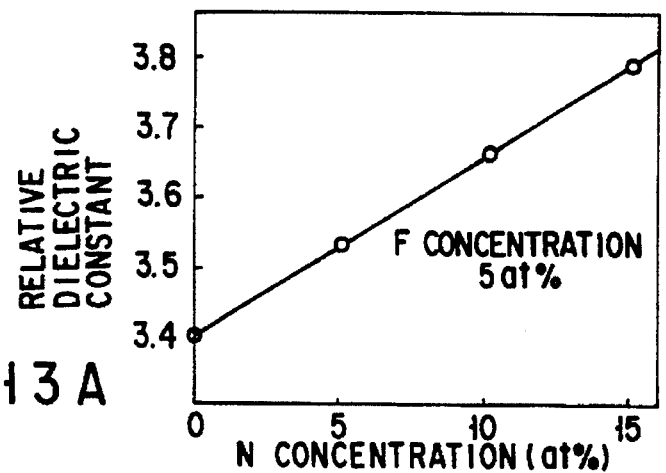
FIGS. 13A and 13B are graphs each showing the properties of the SiO$_2$ film formed in Example 5 of the present invention.
Figure 13B:
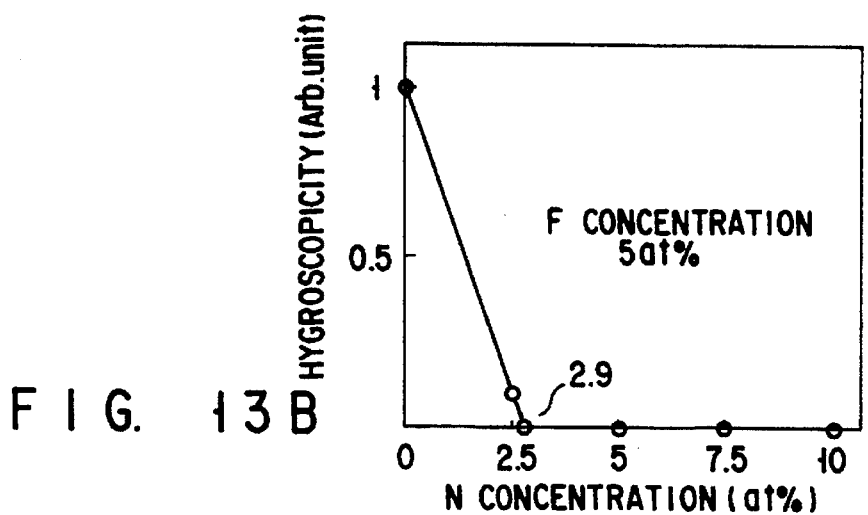

FIGS. 13A and 13B are graphs each showing the properties of the $SiO_2$ film in the case where $HSi(N(CH_3)_2)_3$ is used as a silane gas containing nitrogen. It has been found that, where it is intended to obtain a $SiO_2$ film having a fluorine concentration of, for example, 5 atomic % and a relative dielectric constant of 3.8 or less, it is desirable to set the N concentration in the $SiO_2$ film at 15 atomic % or less, as shown in FIG. 13A. It has also been found that, where the N concentration in the $SiO_2$ film is at least 2.9 atomic %, it is possible to obtain a $SiO_2$ film free from moisture absorption.

In the present invention, it is possible to obtain a $SiO_2$ film low in hygroscopicity, if the N concentration in the silicon oxide film is at least 1 atomic %. On the other hand, if the F concentration in the $SiO_2$ film is at least 3 atomic %, it is possible to form a $SiO_2$ film having a low dielectric constant.

EXAMPLE 6

Figure 14:
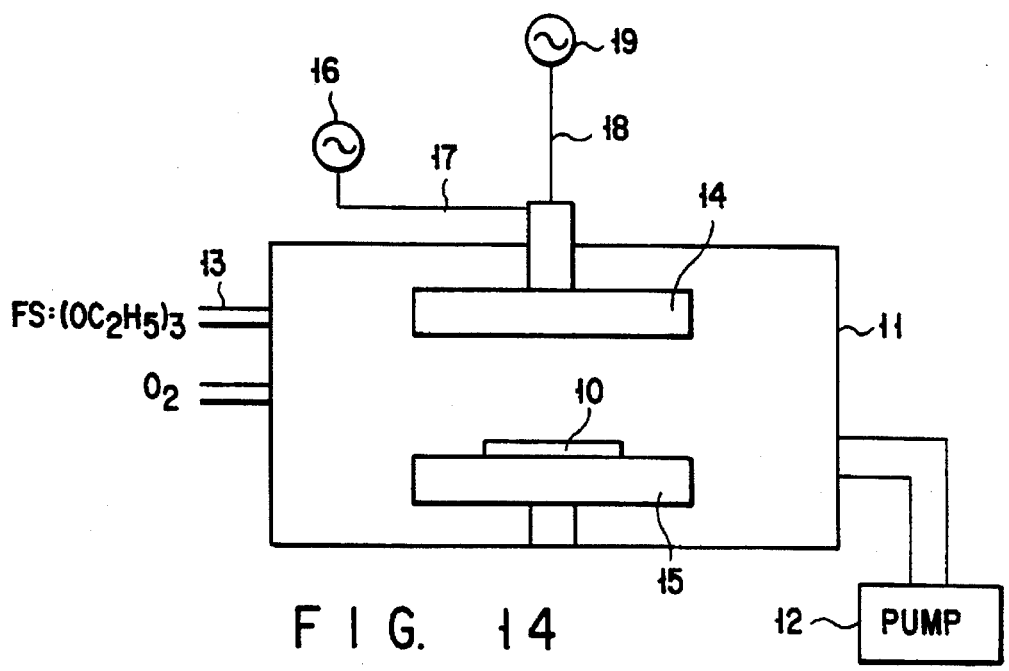
FIG. 14 shows the construction of a deposition apparatus used in Example 6.

FIG. 14 schematically shows the construction of a parallel plate type plasma CVD apparatus which permits excitation with two different frequencies. As shown in the drawing, the gas within a chamber 11 is discharged to the outside by a pump 12. On the other hand, reaction gases are introduced into the chamber 11 through a plurality of quartz nozzles 13. Parallel plate type electrodes 14 and 15 are arranged in parallel within the chamber 11. A high frequency power source 16 of 13.56 MHz is connected to the electrode 14 via a matching box 17. A high frequency power source 19 of 400 kHz is also connected to the electrode 14 via a low pass filter 18. On the other hand, the electrode 15 is connected to the ground potential point. Further, a Si substrate 10 is mounted to the electrode 15.

The apparatus of the construction described above is used for forming a $SiO_2$ film as follows. In the first step, the Si substrate 10 is mounted on the electrode 15 and, then, heated to 400° C. by a resistance heater. In the next step, a $FSi(OC_2H_5)_3$ gas and an $O_2$ gas, which are used as source gases, are simultaneously introduced into the chamber 11 via the quartz nozzles 13 at flow rates of 10 sccm and 20 sccm, respectively so as to set the inner pressure of the chamber 11 at 5 Torr. Under this condition, two different high frequencies of 13.56 MHz with power density of 0.86 W/cm² and 400 kHz with power density of 1.14 W/cm² are applied to the electrode 14 so as to generate a plasma excited by two different frequencies and, thus, to form a $SiO_2$ film.

As lower one of the two different frequencies described above, other frequencies not higher than 1 MHz can be used.

It has been found by an infrared absorption spectrum that the $SiO_2$ film thus formed contains 3 atomic % of F. It has also been found that the F-containing $SiO_2$ film thus formed has such a low relative dielectric constant as 3.4. It has also been found that the F concentration in the $SiO_2$ film can be controlled by controlling the flow rate ratio of the source gases, pressure, substrate temperature and RF power. Further, it has been found that the relative dielectric constant of the $SiO_2$ film tends to be lowered with increase in the F concentration in the $SiO_2$ film.

For comparison, a $SiO_2$ film was formed by using the same source gases. In this case, a high frequency of 13.56 MHz with power density of 0.86 W/cm² alone was applied to the electrode 14 for generating a plasma.

Figure 15:
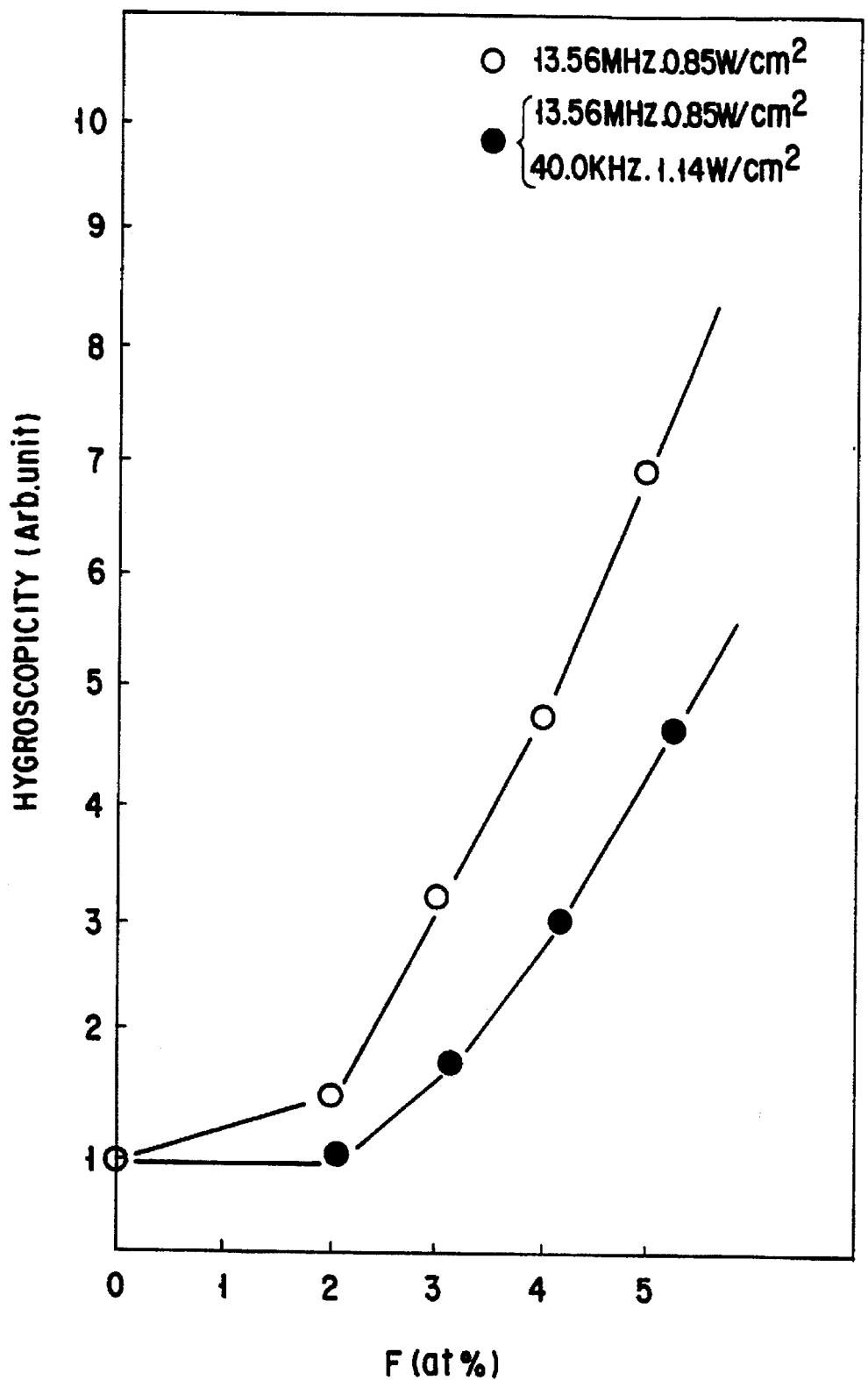
FIG. 15 is a graph showing the relationship between the F concentration in the SiO$_2$ film and the hygroscopicity of the SiO$_2$ film.

The two kinds of the F-containing $SiO_2$ films formed by the methods described above were left to stand under the air atmosphere having a temperature of 25° C. and a humidity of 50% for one week. Then, infrared absorption spectrums were measured so as to examine the hygroscopicity of the $SiO_2$ films, with the results as shown in FIG. 15. It is clearly seen that, in each of these two cases, the hygroscopicity of the $SiO_2$ film tends to be increased with increase in the F concentration. However, if the comparison is made under the same F content of the $SiO_2$ film, the $SiO_2$ film involving excitation with two different frequencies is clearly lower in its hygroscopicity than the other $SiO_2$ film.

Figure 16:
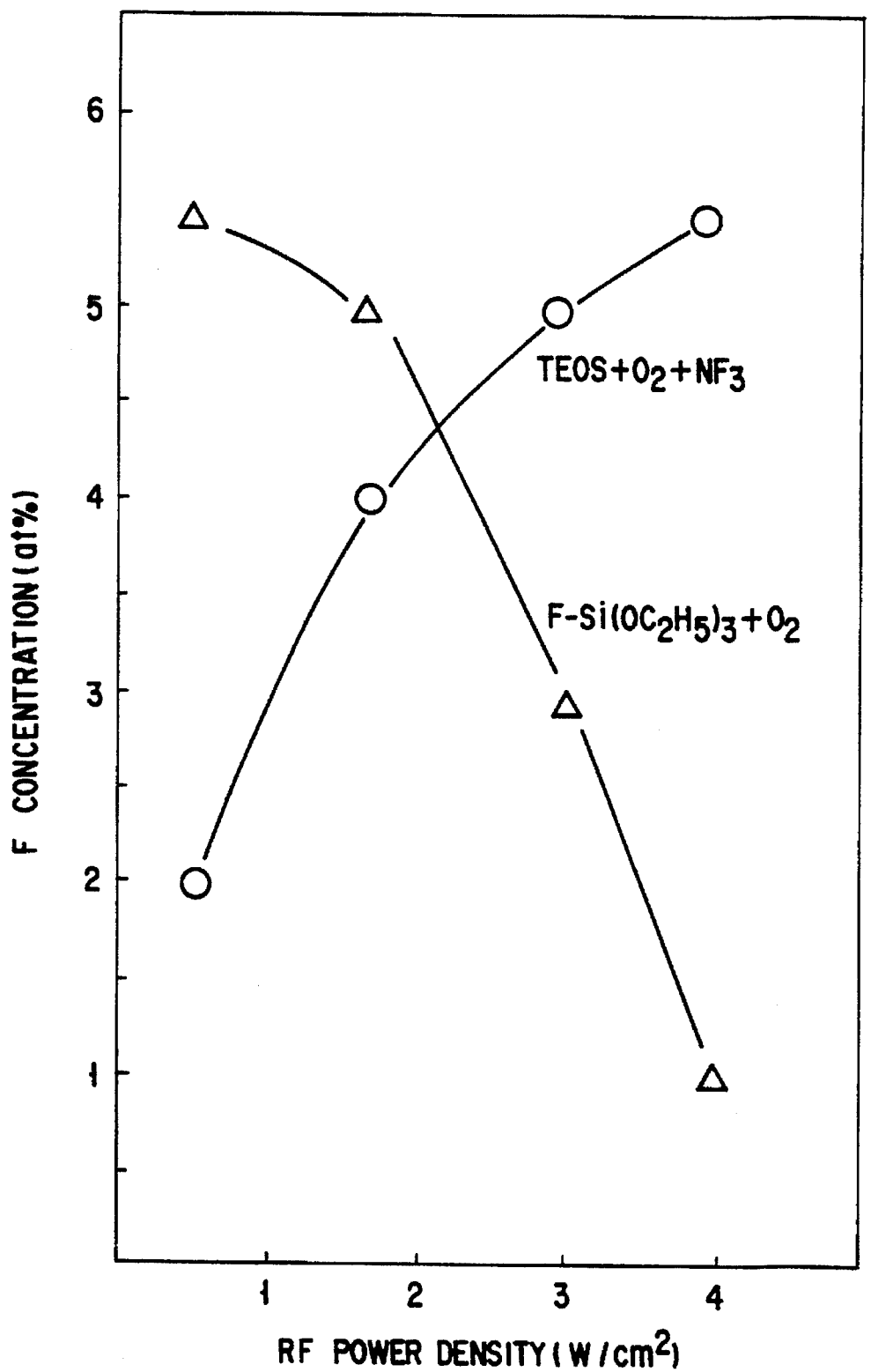
FIG. 16 a graph showing the relationship between the power density and the F concentration in the SiO$_2$ film.

An additional comparative test was conducted between the use of $FSi(OC_2H_5)_3$ and $O_2$ as the source gases and the use of TEOS, $O_2$ and $NF_3$ as the source gases. FIG. 16 shows the relationship between the RF power density and the F concentration in the $SiO_2$ film in each of these two cases. It is clearly seen from FIG. 16 that, in the case of using TEOS, $O_2$ and $NF_3$ as the source gases, the F concentration is lowered with decrease in the RF power applied to the electrode. This clearly indicates that it is necessary to increase the RF power in order to maintain a constant F concentration. If the RF power is unduly high, however, a problem takes places that the gate is destroyed by the charged particles. On the other hand, in the case of using $FSi(OC_2H_5)_3$ and $O_2$ as the source gases, the F concentration is increased with decrease in the RF power applied to the electrode, making it possible to increase the F concentration in the $SiO_2$ film without difficulty. Naturally, the gate is unlikely to be destroyed by the charged particles.

As described above, in the case of exciting the source gases consisting of $FSi(OC_2H_5)_3$ and $O_2$ with two different high frequencies, the gate is unlikely to be destroyed by the charged particles, making it possible to obtain a $SiO_2$ film having a low dielectric constant and a low hygroscopicity.

Incidentally, it is possible to use other F-containing organic silane gas such as $F_2Si(OC_2H_5)_2$ in place of $FSi(OC_2H_5)_3$ noted above, with substantially the same effect.

EXAMPLE 7

FIG. 17 schematically shows the construction of a plasma CVD apparatus used in this example. As shown in the drawing, the plasma CVD apparatus comprises a chamber 101 made of an Al alloy, a quartz discharge tube 102, and a vacuum pump 103. Source gases are introduced into the chamber 101 through a nozzle 104 positioned at one end of the quartz discharge tube 102 and through a ring-like nozzle 105 positioned within the chamber 101. The pressure within the chamber 101 can be controlled as desired by a conductance valve 106 mounted in the gas discharge port and by the vacuum pump 103. A double loop type discharge antenna 107 as shown in FIG. 18 is mounted within the quartz discharge tube 102. An RF power source 108 is connected via a matching box to one end of the discharge antenna 107, with the other end of the discharge antenna connected to the ground potential point. An electromagnetic coil 109 serves to generate a uniform magnetic field of 400 Gauss within the discharge tube 102. It should be noted that the magnetic field generated by the electromagnetic coil 109 is uniform within the discharge tube 102, but has a gradient within the chamber 101 so as to be lowered in its magnetic field intensity with increase in the distance from the electromagnetic coil 109. A Si substrate 10 is mounted on a supporting plate 110 which is about 5 cm apart from the discharge tube 102. The supporting plate 110 is provided with a heating mechanism and with a mechanism for applying DC and AC voltages, making it possible to impart a desired temperature and a desired substrate bias to the Si substrate 10.

Let us describe how to form a $SiO_2$ film by using the apparatus of the particular construction described above. Specifically, the Si substrate 10 is mounted on the supporting plate 110. The substrate temperature is maintained at 200° C., and a potential of 20 V is applied to the substrate. Source gases of TEOS, $O_2$ and $NF_3$ are simultaneously supplied into the chamber 101 at the flow rates of 5 sccm, 10 sccm and 10 sccm, respectively. The $O_2$ and $NF_3$ gases are supplied through the nozzle 104, with the TEOS gas being supplied through the ring-like nozzle 105. At the same time, an RF power of 13.56 MHz (1000 W) is applied to the discharge antenna 107 so as to enable the electromagnetic coil 109 to generate a uniform magnetic field of 400 Gauss within the discharge tube 102. The film-forming pressure is set at 5 mTorr. As a result, a helicon wave is generated within the discharge tube 102, with the result that a high density plasma is generated within the discharge tube 102.

Under the conditions described above, the substrate bias is 20 V, the plasma potential is 30 V, and the ion energy is 10 eV. The plasma state was monitored by a Langmuir probe, with the result that the plasma density on the Si substrate 10 was found to be $3.5 \times 10^{11}/cm^3$ (ionization rate of 0.2%) under the pressure of 5 mTorr. Also, the growing rate of the silicon oxide film was found to be 20 nm/min.

The infrared absorption spectrum of the $SiO_2$ film thus formed was equal to that shown in FIG. 3. To reiterate, the absorption derived from the Si—O bond was observed at the wave numbers of 1080 $cm^{-1}$, 810 $cm^{-1}$ and 450 $cm^{-1}$ Also, the absorption derived from the Si—F bond was observed at the wave number of 940 $cm^{-1}$. However, the absorption derived from the H—OH bond or the Si—OH bond was not recognized at all within the wave number region of between 3200 $cm^{-1}$ and 3800 $cm^{-1}$. The $SiO_2$ film was found to have a F concentration of 3 atomic % and to exhibit a relative dielectric constant as low as 3.6.

The $SiO_2$ film thus obtained was left to stand under the air atmosphere having a temperature of 25° C. and a humidity of 50% for 1 week. Then, the infrared absorption spectrum was measured, with the result that no increase was recognized in the absorption derived from the H—OH bond or the Si—OH bond within the wave number region of 3200 $cm^{-1}$ and 3800 $cm^{-1}$ It has been found that the F concentration in and the dielectric constant of the $SiO_2$ film can be controlled in this method, too, by controlling the flow rate of the $NF_3$ gas. A similar effect can be produced by using gases such as $CF_4$, $C_2F_6$, $FSi(OC_2H_5)_3$, and $F_2Si(OC_2H_5)_2$ in place of the $NF_3$ gas. In order to increase the F concentration, it is particularly effective to use $FSi(OC_2H_5)_3$ in combination with other gaseous compound such as $NF_3$ or $CF_4$.

FIG. 19 shows the relationship between the F concentration and the moisture absorption in respect of the $SiO_2$ film formed by the method of the present invention. As seen from the graph of FIG. 19, no increase in hygroscopicity was recognized in the case of forming the $SiO_2$ film by the method of the present invention, even if the F concentration was increased to reach 8 atomic %.

EXAMPLE 8

FIG. 20 schematically shows the construction of a plasma CVD apparatus used in this example. As seen from the drawing, the gas within a chamber is discharged to the outside by a pump 12, and a reaction gas is introduced into the chamber 11 through a quartz nozzle 13. Parallel plate type electrodes 14 and 15 are disposed in parallel within the chamber 11. A high frequency power source 16 is connected to the electrode 14 via a matching box. On the other hand, the electrode 15 is connected to the ground potential point. A silicon substrate 10 is mounted on the electrode 15. The apparatus also comprises a permanent magnet or an electromagnet 120 capable of applying a magnetic field of 400 Gauss to the discharge region.

Let us describe how to form a $SiO_2$ film by using the plasma CVD apparatus of the construction described above. In the first step, the silicon substrate 10 is mounted on the electrode 15, which is maintained at 400° C. by a resistance heater. Source gases of TEOS, $O_2$ and $NF_3$ are simultaneously introduced into the chamber 11 through a nozzle 13 at the flow rates of 5 sccm, 10 sccm and 10 sccm, respectively. Under this condition, an RF power of 13.56 MHz (500 W) is applied to the electrode 14 so as to generate a plasma and, thus, to deposit a $SiO_2$ film. In this step, the electrons are caused to make drifting motions by the magnetic field. As a result, secondary electrons are increased by the r-effect on the silicon substrate so as to promote the ionization.

Under the conditions described above, the substrate bias is 10 V, the plasma potential is 50 V, and the ion energy is 40 eV. When the plasma state was monitored, the plasma density on the Si substrate 10 was found to be $1.8 \times 10^{11}/cm^3$ (ionization rate of 0.1%) under the pressure of 5 mTorr. Also, the growing rate of the silicon oxide film was found to be 100 nm/min. Further, it was found from the infrared absorption spectrum that the $SiO_2$ film thus formed contained 3 atomic % of F. Further, the relative dielectric constant of the $SiO_2$ film was found to be as low as 3.6.

The $SiO_2$ film thus obtained was left to stand under the air atmosphere having a temperature of 25° C. and a humidity of 50% for 1 week. Then, the infrared absorption spectrum was measured, with the result that no increase was recognized in the absorption derived from the H—OH bond or the Si—OH bond within the wave number region of between 3200 $cm^{-1}$ and 3800 $cm^{-1}$.

Further, it has been found possible to control the F concentration and the dielectric constant of the $SiO_2$ film by controlling the $NF_3$ flow rate and the kinds of the source gases.

EXAMPLE 9

FIG. 21 schematically shows the construction of an electron beam-excited plasma CVD apparatus used in this example. As seen from the drawing, the plasma CVD apparatus can be roughly divided into three vacuum chambers. In other words, the apparatus comprises a vacuum chamber 206 in which a plasma is generated by discharge, a vacuum chamber 205 in which the electrons are withdrawn and accelerated from the plasma generated within the vacuum chamber 206, and a vacuum chamber 201 in which the reactive gas is irradiated with the electrons accelerated within the vacuum chamber 205 so as to generate an ionized and activated plasma for forming an insulating film on the Si substrate 10.

An electrode 212 is mounted at one end of the vacuum chamber 206. A discharge gas 214 is introduced into the vacuum chamber 206 through a gas inlet port 213 formed in the central portion of the electrode 212. A thermoelectron releasing material 221 is disposed around the gas inlet port 213. The vacuum chamber 206 is partitioned from the vacuum chamber 205 by an electrode 211. The electrode 211 is provided with a coil 216, and an orifice 218 is formed in the central portion of the electrode 211. Further, the vacuum chamber 205 is partitioned from the vacuum chamber 201 by an electrode 211, which is provided with a coil 215 and has an orifice 218 formed in the central portion thereof.

A Si substrate 10 is supported on a supporting plate $2O_3$. The supporting plate $2O_3$ is provided with a heating mechanism and is connected to a power source, with the result that a desired temperature and a desired bias can be imparted to the Si substrate 10. A source gas 220 is introduced into the vacuum chamber 210 through a gas inlet port 219, and is discharged to the outside through a discharge port 204. The discharge port 204 is capable of controlling the conductance and of imparting an optional pressure to the vacuum chamber 201.

Let us describe how to form a $SiO_2$ film by using the apparatus of the particular construction described above. In the first step, the Si substrate is mounted on the supporting plate 203 and heated to 400° C. The vacuum chamber 201 is discharged to achieve a vacuum of about $10^{-5}$ Torr. Then, source gases of TEOS, $O_2$ and $NF_3$ are introduced through the gas inlet port 219 into the vacuum chamber 201 at the flow rates of 5 to 10 sccm, 10 to 30 sccm, and 5 to 20 sccm, respectively. In this step, the pressure within the vacuum chamber 201 is set at 0.5 mTorr by controlling the conductance of the discharge port 204. A potential of −80 V is applied to the supporting plate 203. Under this condition, an accelerated electron beam of, for example, 100 eV is introduced under a current of 10 A from the vacuum chambers 206 and 205 into the vacuum chamber 201 so as to ionize the source gases and, thus, to generate an activated plasma.

Under the conditions described above, the substrate bias is −80 V, the plasma potential is 10 V, and the ion energy is +70 eV. When the plasma state was monitored, the plasma density was found to be $3 \times 10^{10}/cm^3$ (ionization rate of 0.2%) under the pressure of 0.5 mTorr.

The method described above makes it possible to form a F-containing $SiO_2$ film having a fluorine concentration of 3 atomic % and a relative dielectric constant of 3.6. The $SiO_2$ film thus formed was left to stand under the air atmosphere for one week. The infrared absorption spectrum of the $SiO_2$ film after exposure of the $SiO_2$ film to the air atmosphere was found to be substantially equal to that immediately after the film formation. Particularly, no absorption was recognized in the wave number region of 3200 to 3800 $cm^{-1}$ within which vibrations of H—OH and Si—OH are exhibited, indicating that it is possible to obtain a F-added $SiO_2$ film which is stable even after exposure to the air atmosphere for one week. The relative dielectric constant of the $SiO_2$ film after exposure to the air atmosphere for one week was also found to be substantially equal to that immediately after the film formation.

Let us describe another method of manufacturing a F-added $SiO_2$ film, which is stable even after exposure to the air atmosphere, by using other reaction gases. Specifically, a F-added $SiO_2$ film was formed as above, except that $FSi(OC_2H_5)_3$ and $O_2$ gases, which were used as the reaction gases, were introduced into the reaction chamber at the flow rates of 10 sccm and 40 sccm, respectively, and that the substrate bias was set at −70 V. The film thus formed was found to be a $SiO_2$ film having a fluorine concentration of 3 atomic % and a relative dielectric constant of 3.6. The $SiO_2$ film thus formed was allowed to stand under the air atmosphere for one week. The infrared absorption spectrum and the specific dielectric constant of the $SiO_2$ film after the exposure to the air atmosphere were found to remain unchanged from the state immediately after the film formation. It should be noted that the fluorine concentration in the $SiO_2$ film can be increased to about 10 atomic % by adding a $F_2$ gas, which is supplied at a flow rate of 0 to 1000 sccm, to the mixture of the $SiF(OC_2H_5)_3$ and $O_2$ gases. Even if the fluorine concentration is varied in this fashion, it is possible to obtain a F-added $SiO_2$ film which is stable even after exposure to the air atmosphere. Further, in the case of using a Si-containing similar gas having a general formula $SiF_n(OC_2H_5)_{4-n}$, it is also possible to obtain a F-added $SiO_2$ film which is stable even after exposure to the air atmosphere, though differences are brought about in the fluorine concentration and the relative dielectric constant.

A F-added $SiO_2$ film was also formed as above, except that $SiH_4$, $O_2$ and $CF_4$ were introduced into the reaction chamber at the flow rates of 10 sccm, 40 sccm and 10 sccm, respectively, and that the substrate bias was set at −70 V. These source gases have also been found to permit formation of a F-added $SiO_2$ film stable even after exposure to the air atmosphere. An effect similar to that described above can also be obtained in the case of using $SiF_4$, $SiCl_4$, $SiH_2Cl_2$ and $Si_2H_6$ as a source gas containing silicon.

Let us analyze the relative dielectric constant and the hygroscopicity of a F-added $SiO_2$ film on the basis of the Examples described above in an attempt to look into the conditions under which a preferred film of F-added $SiO_2$ can be obtained.

First of all, it has been clarified as shown in FIG. 22 that the relative dielectric constant of the $SiO_2$ film is determined by the F concentration in the $SiO_2$ film regardless of the method of forming the film.

On the other hand, the hygroscopicity of the $SiO_2$ film is greatly dependent on the method of forming the film. To be more specific, when it comes to the F-added $SiO_2$ film formed by the ordinary parallel plate type plasma CVD method, the hygroscopicity of the $SiO_2$ film is increased with increase in the F concentration in the film, as shown in, for example, FIG. 6. On the other hand, when it comes to the F-added $SiO_2$ film formed by the method of Examples 7–9, the $SiO_2$ film is substantially free from moisture absorption as far as the F concentration is not higher than 8 atomic %, as shown in, for example, FIG. 19.

Figure 23:
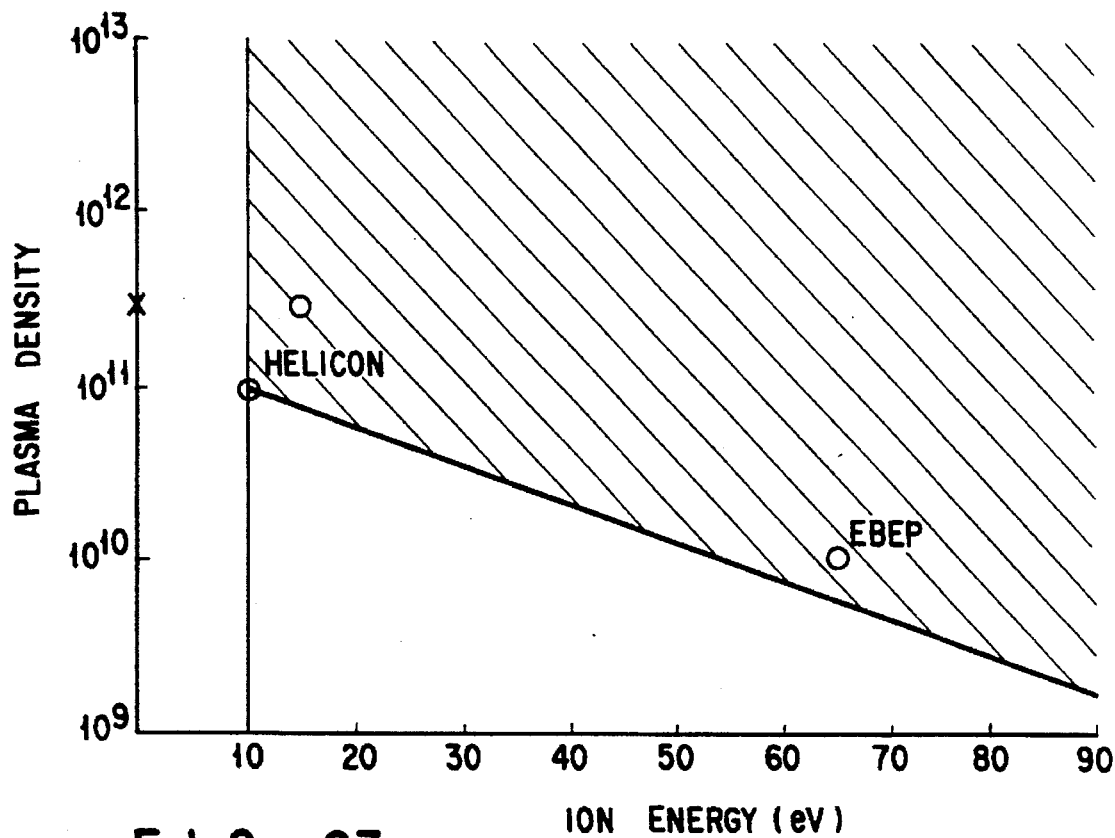
FIG. 23 is a graph showing the conditions in terms of the relationship between the ion energy and the plasma density for obtaining a $SiO_2$ film which is low in its hygroscopicity.
Figure 24:
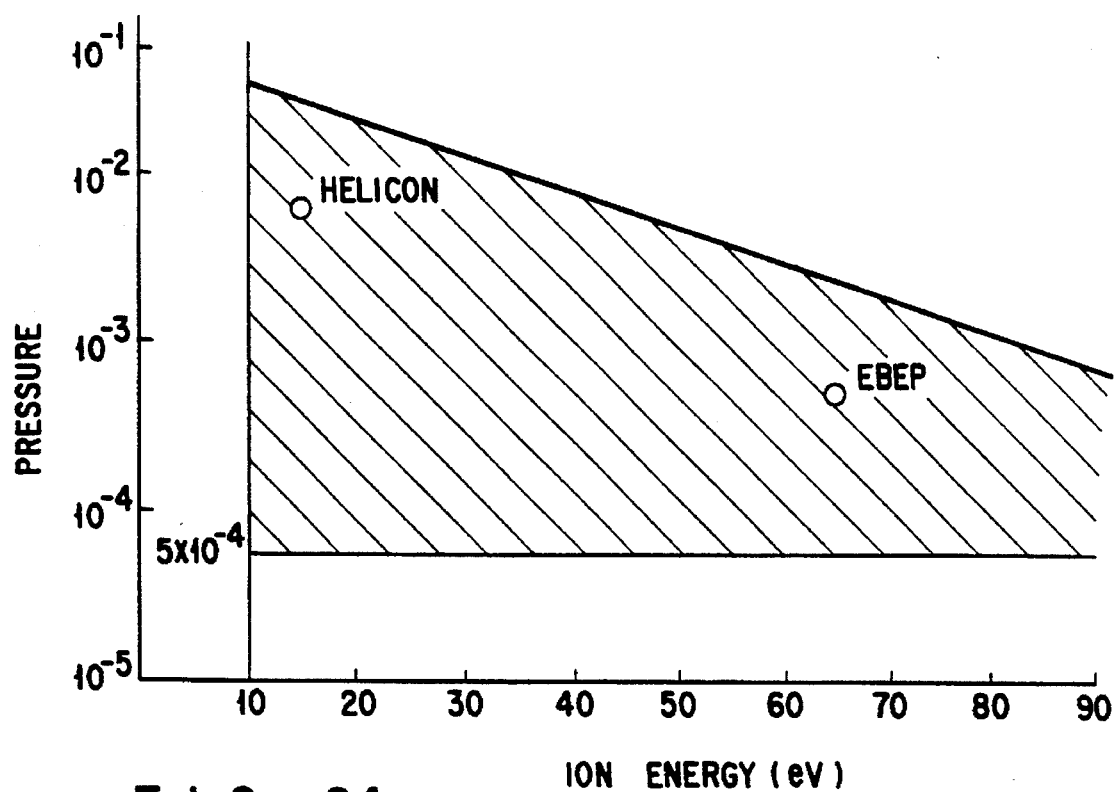
FIG. 24 is a graph showing the conditions in terms of the relationship between the ion energy and the pressure for obtaining a $SiO_2$ film which is low in its hygroscopicity.

On the basis of the analytical result described above, a F-added $SiO_2$ film was formed by the method of Examples 7–9, except that the power applied to the electrode, the pressure within the reaction chamber, and the substrate bias were changed appropriately, so as to determine the ion energy, plasma density, and the pressure within the reaction chamber, which are adapted for obtaining a F-added $SiO_2$ film free from moisture absorption even after exposure to the air atmosphere for one week. FIGS. 23 and 24 show the results. It should be noted that the shaded portions in these graphs represent the preferred conditions. For example, it is possible to markedly diminish the hygroscopicity of the $SiO_2$ film, if a F-added $SiO_2$ film is formed under the pressure of 5 mTorr within the reaction chamber, the ion energy of 20 eV and the plasma density of $10^{11}$ atoms/$cm^3$ in each of Examples 7 to 9. On the other hand, if a F-added $SiO_2$ film is formed by the ordinary parallel plate type plasma CVD method under the pressure of 5 Torr within the reaction chamber, the ion energy of 50 eV and the plasma density of $10^9$ atoms/$cm^3$, the hygroscopicity of the $SiO_2$ is markedly increased.

Figure 25:
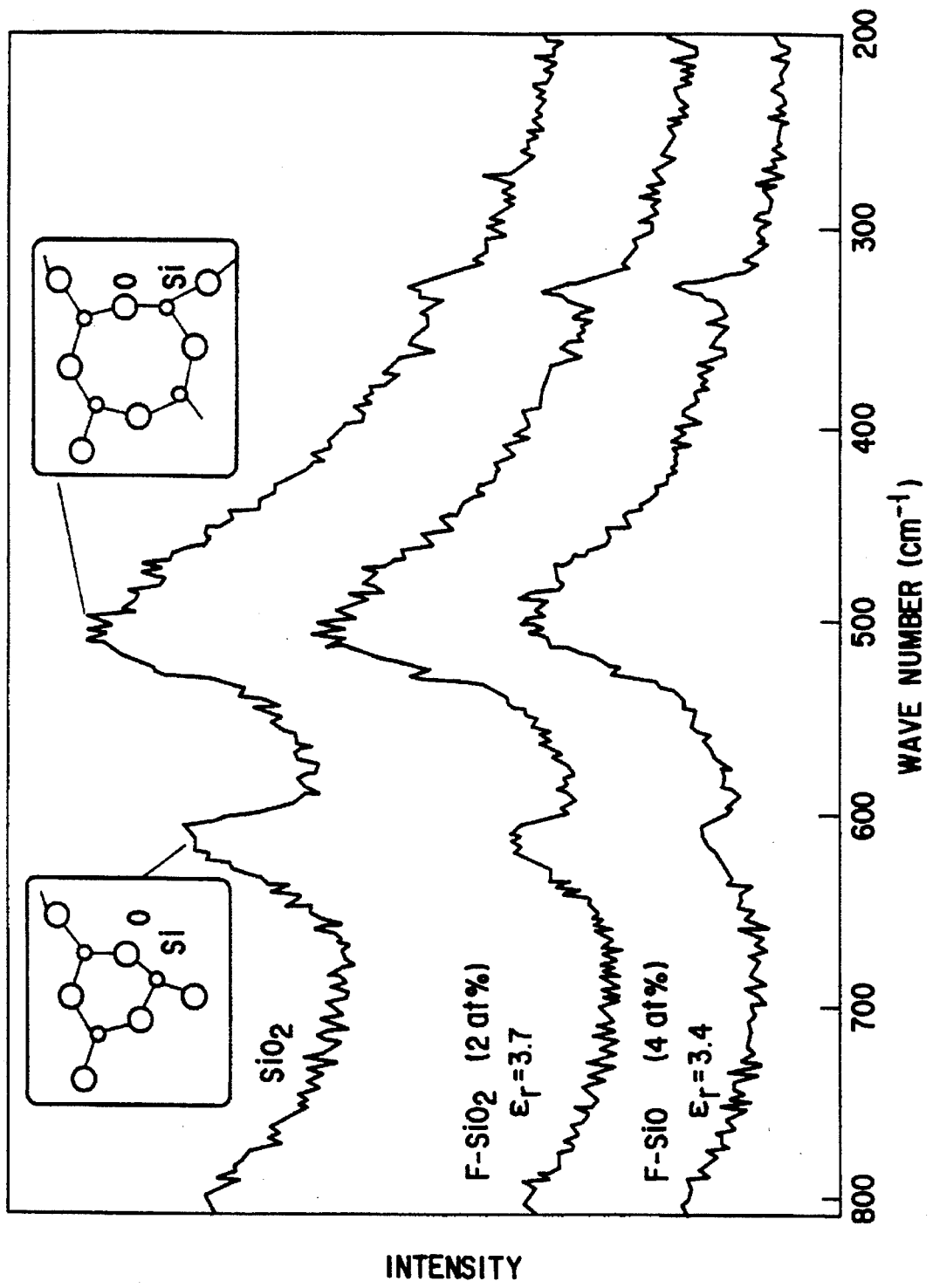
FIG. 25 shows the Raman spectrums of the $SiO_2$ films formed in Examples 7 to 9 of the present invention.

Further, let us look into in detail the relationship between the chemical structure and the properties of the F-added $SiO_2$ film. First of all, F is present in the $SiO_2$ film in the form of a Si—F bond regardless of the plasma forming method, as apparent from the infrared absorption spectrum. FIG. 25 shows the Raman spectrums of three kinds of $SiO_2$ films differing from each other in the F concentration. In the Raman spectrum, peaks derived from the 3-membered ring (—Si—O—)$_3$ are recognized around the wave number of 600 cm$^{-1}$ Also, peaks derived from 4-membered ring (—Si—O—)$_4$ are recognized around the wave number of 500 cm$^{-1}$. As shown in FIG. 25, the peak intensity derived from the 3-membered ring is decreased with increase in the F concentration in the SiO$_2$ film. On the other hand, the peak intensity derived from the 4-membered ring is increased with increase in the F concentration in the SiO$_2$ film.

As described previously, the relative dielectric constant of the SiO$_2$ film is lowered with increase in the F concentration in the SiO$_2$ film. It is considered reasonable to understand that, if the F concentration in the SiO$_2$ film is increased, the Si—F bond is increased, and the 3-membered ring is decreased, so as to lower the density of the SiO$_2$ film and, thus, to lower the relative dielectric constant. The particular effect is determined solely by the F concentration in the SiO$_2$ film, and is quite irrelevant to the method of forming the SiO$_2$ film.

Figure 26:
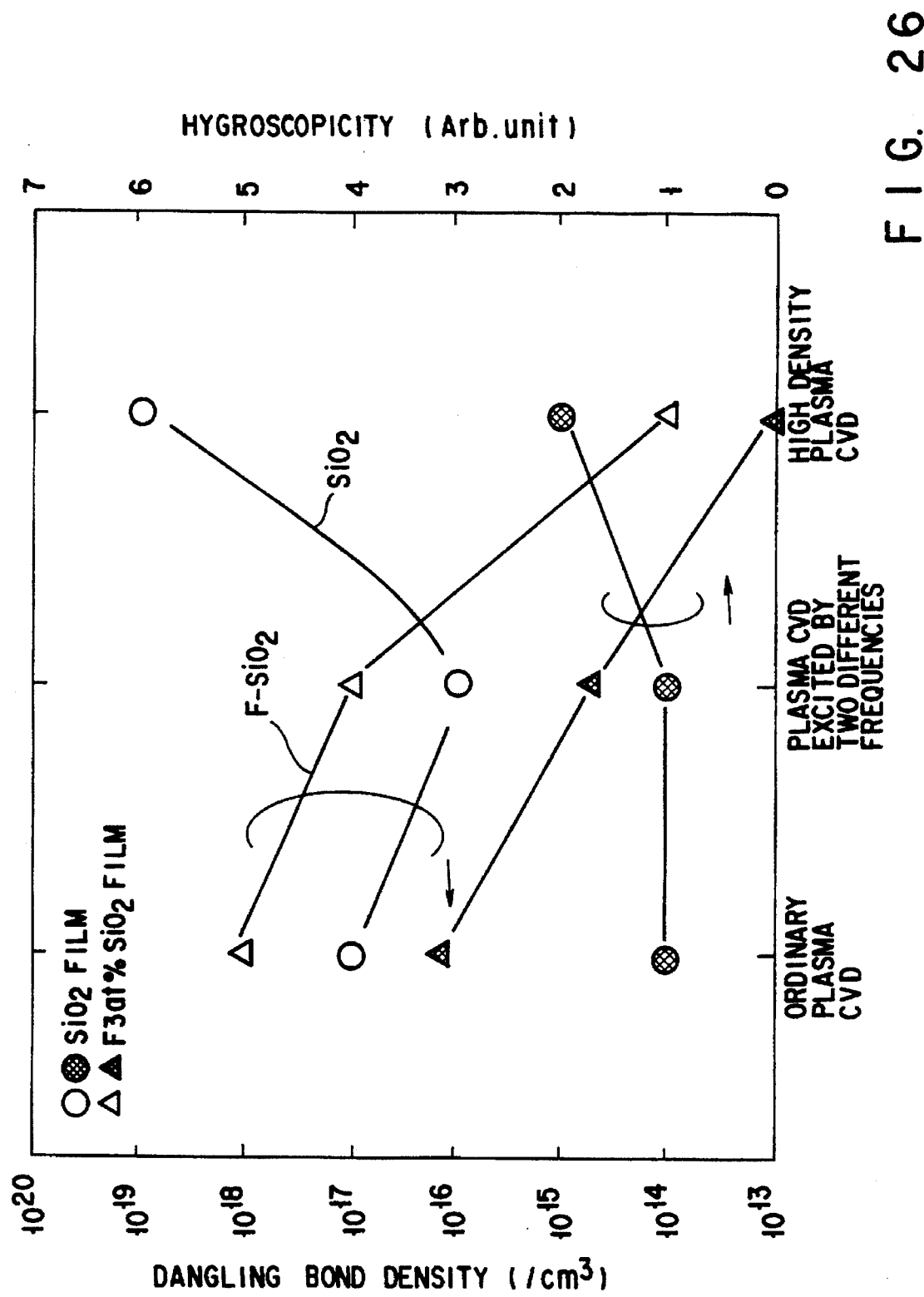
FIG. 26 is a graph showing the Si dangling bond density and the hygroscopicity of the $SiO_2$ film, which are changed depending on the method employed for forming the $SiO_2$ film.

Further, the hygroscopicity of the SiO$_2$ film is dependent on the method of forming the SiO$_2$ film, as described previously. To be more specific, FIG. 26 shows the relationship among the method forming a SiO$_2$ film, the Si dangling bond density measured by ESR (Electron Spin Resonance) analysis, and the hygroscopicity of the SiO$_2$ film in respect of each of a SiO$_2$ film which does not contain F and a F-added SiO$_2$ film. In the Si dangling bond, H$_2$O is trapped by the reaction mechanism shown below and, thus, the Si dangling bond is considered to be related to the hygroscopicity of the SiO$_2$ film:

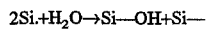

2Si.+H$_2$O→Si—OH+Si—

In the case of forming a SiO$_2$ film by the ordinary parallel plate type plasma CVD method, a SiO$_2$ film containing 3 atomic % of F exhibits a Si dangling bond density and a hygroscopicity higher than those of a SiO$_2$ film which does not contain F. In other words, the increased Si dangling bond facilitates the reaction with water. In addition, the ring structure is enlarged with increase in the F concentration so as to facilitate the water diffusion. It follows that, when it comes to the SiO$_2$ film formed by the ordinary parallel plate type plasma CVD method, the hygroscopicity of the SiO$_2$ film is increased with increase in the F concentration.

On the other hand, when it comes to a SiO$_2$ film formed under the conditions falling within the preferred ranges shown in FIGS. 23 and 24 as in Examples 7–9, the SiO$_2$ film containing 3 atomic % of F exhibits a Si dangling bond density and a hygroscopicity lower than those of the SiO$_2$ film which does not contain F. Particularly, the Si dangling bond density of the SiO$_2$ film containing 3 atomic % of F is as low as at most 10$^{16}$/cm$^3$.

Figure 27:
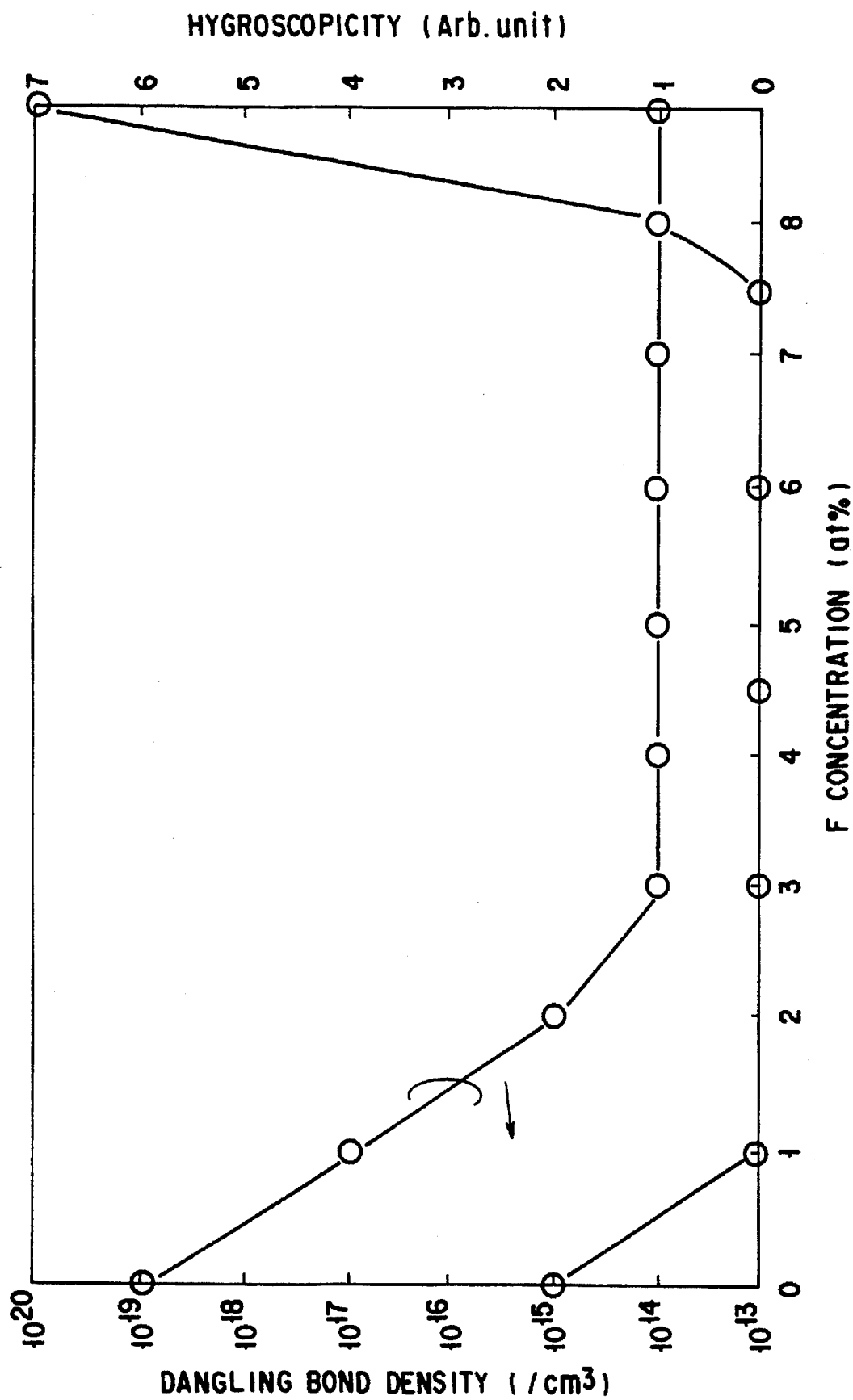
FIG. 27 is a graph showing the relationship among the F concentration in the $SiO_2$ film, the Si dangling bond density, and the hygroscopicity of the $SiO_2$ film in respect of the $SiO_2$ films formed in Examples 7 to 9 of the present invention.

FIG. 27 shows the relationship among the F concentration, the Si dangling bond density, and the hygroscopicity of the SiO$_2$ film in respect of the SiO$_2$ films formed under the conditions falling within the preferred ranges shown in FIGS. 23 and 24. As apparent from FIG. 27, the Si dangling bond density is lowered with increase in the F concentration. Also, the hygroscopicity of the F-added SiO$_2$ film is very low where the F concentration falls within a range of between 1 and 8 atomic %.

As described above, the Si dangling bond density is lowered in the case where a F-added SiO$_2$ film is formed under the conditions falling within the preferred ranges shown in FIGS. 23 and 24. It should be noted that, if the F-added SiO$_2$ film is formed under the particular conditions, the ionization rate is increased so as to provide a large number of active F radicals. These active F radicals perform reactions with the Si dangling bonds so as to lower the Si dangling bond density. It should also be noted that the hygroscopicity of the SiO$_2$ film is increased where the F concentration in the film is not lower than 8 atomic %, as described previously. This is because the high F concentration greatly affects the enlargement of the ring structure, though the Si dangling bond density is low.

As described above, a F-added SiO$_2$ film exhibiting a low dielectric constant and a low hygroscopicity can be obtained regardless of the kinds of the source gases, if the SiO$_2$ film is formed under the conditions falling within the preferred ranges shown in FIGS. 23 and 24.

As described above in detail, the present invention makes it possible to provide a SiO$_2$ film exhibiting a low dielectric constant and a very low hygroscopicity.

What is claimed is:

1. A semiconductor device, which comprises:

a silicon oxide film formed on a silicon substrate, said silicon oxide film containing 3 at % or more of fluorine and 1 at % or more of nitrogen.

2. The semiconductor device according to claim 1, wherein the fluorine concentration of said silicon oxide film is 5 at % or more.

3. The semiconductor device according to claim 1, wherein the nitrogen concentration of said silicon oxide film is 15 at % or less.

4. The semiconductor device according to claim 1, wherein said silicon oxide film is formed by plasma CVD.

* * * * *